US 6,528,808 B1

(12) United States Patent
Takiguchi

(10) Patent No.: US 6,528,808 B1
(45) Date of Patent: Mar. 4, 2003

(54) TRANSMITTING PHOTOELECTRIC SENSOR ARRAY

(75) Inventor: Hideaki Takiguchi, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/381,335

(22) PCT Filed: Mar. 19, 1998

(86) PCT No.: PCT/JP98/01186
§ 371 (c)(1),
(2), (4) Date: Sep. 20, 1999

(87) PCT Pub. No.: WO98/42018
PCT Pub. Date: Sep. 24, 1998

(30) Foreign Application Priority Data

Mar. 19, 1997 (JP) .............................................. 9-085687
Jun. 27, 1997 (JP) .............................................. 9-187583

(51) Int. Cl.$^7$ .............................................. G01N 21/86
(52) U.S. Cl. ............................. 250/559.12; 250/559.33; 250/559.29
(58) Field of Search .......... 250/559.33, 559.12–559.15, 250/208.6, 221, 239, 216, 206.1–206.3, 223 R, 559.29, 559.3; 257/80–84; 356/400, 433–435, 338, 340–343, 150, 151; 340/555–557, 541

(56) References Cited

U.S. PATENT DOCUMENTS

| 3,584,226 A | * | 6/1971 | Lerner ..................... 250/222.1 |
| 3,623,057 A | * | 11/1971 | Hedin et al. ................ 340/557 |
| 4,347,438 A | * | 8/1982 | Spielman ................... 250/221 |
| 4,607,160 A | * | 8/1986 | Sakakino ................ 250/227.21 |
| 4,912,316 A | * | 3/1990 | Yamakawa .................. 250/221 |
| 5,255,916 A | * | 10/1993 | Bleich ..................... 273/118 D |
| 5,354,995 A | | 10/1994 | Endo et al. ................. 250/561 |
| 5,383,783 A | | 1/1995 | Ishimori .................... 432/253 |
| 5,670,778 A | * | 9/1997 | Smith ....................... 250/221 |
| 5,909,028 A | * | 6/1999 | Yamamoto .................. 250/221 |

FOREIGN PATENT DOCUMENTS

| JP | 4-138303 | 5/1992 |
| JP | 4-249338 | 9/1992 |
| JP | 5-167357 | 7/1993 |
| JP | 5-312948 | 11/1993 |
| JP | 6-11070 | 2/1994 |
| JP | 6-77307 | 3/1994 |
| JP | 6-120321 | 4/1994 |
| JP | 8-235979 | 9/1996 |

* cited by examiner

Primary Examiner—Que T. Le
Assistant Examiner—Thanh X. Luu
(74) Attorney, Agent, or Firm—Foley & Lardner

(57) ABSTRACT

A plurality of sensing arms are provided at intervals on a sensor case so as to project outwardly of the case. A light-projecting element and a photoreceptor element forming a pair are provided in the sensor case so as to correspond to respective ones of the sensing arms. Projected light from the light-projecting element advances along the longitudinal direction of the respective sensing arm and is reflected by a reflecting surface so as to be directed toward the neighboring sensing arm through a sensing area. The projected light is reflected twice by reflecting surfaces on the neighboring sensing arm so as to return to the original sensing arm through the sensing area again. The light is reflected by the reflecting surface of this sensing arm, advances along the longitudinal direction of this sensing arm again and is received by the photoreceptor element.

18 Claims, 33 Drawing Sheets

TRANSMITTING PHOTOELECTRIC SENSOR ARRAY

TECHNICAL FIELD

This invention relates to a multiple transmission-type photoelectric sensor for sensing a plurality of objects at one time, a single transmission-type photoelectric sensor capable of being applied particularly to a multiple transmission-type photoelectric sensor, and a photoelectric sensing method.

BACKGROUND ART

Available as one example of a multiple transmission-type photoelectric sensor is a wafer sensor used in a semiconductor-wafer manufacturing process to check semiconductor wafers to determine whether or not they are present, monitor the wafers and verify the number thereof on a lot-by-lot basis.

Sensors described in the specifications of Japanese Patent Publication No. 6-11070 and Japanese Utility Model Application Laid-Open No. 5-66987 are examples of wafer sensors. The wafer sensors described in this literature include a light-projecting element and a photoreceptor element forming a pair and disposed so as to oppose each other. A multiplicity of these light-projecting and photoreceptor elements are inserted between wafers held in a wafer cassette at regular intervals in such a manner that the wafers will be sandwiched by the pairs of light-projecting and photoreceptor elements. A pair of the light-projecting and photoreceptor elements sandwiching a wafer constructs a transmission-type photoelectric sensor. Light projected from the light-projecting element is blocked if a wafer is present but is received by the corresponding photoreceptor element in the absence of a wafer.

Since a semiconductor wafer is opaque, its absence or presence can be sensed on the basis of whether or not the projected light is blocked, as described above. In recent years, transparent or semi-transparent wafers that rely on quartz glass, sapphire glass, liquid-crystal glass and silicon-carbide glass have come to be used for a variety of applications. These transparent or semi-transparent wafers cannot be sensed by, or are difficult to sense by, the above-mentioned wafer sensor. The reason for this is that a transparent wafer transmits most of the projected light from the light-projecting element so that the projected light reaches the photoreceptor element with little attenuation. The difference in amount of light received by the photoreceptor element when a transparent wafer is and is not present is very small and is difficult to identify. In addition, extraneous light and a change in the characteristics of the light-projecting and photoreceptor elements due to temperature are not negligible.

A wafer sensor that is applicable to both transparent and opaque wafers is illustrated in the specification of Japanese Patent Application Laid-Open No. 6-77307. This wafer sensor includes a first element having a light-emitting surface and a photoreceptor surface, and a second element having a photoreceptor surface, the elements being disposed so as to oppose each other. A wafer is inserted between the first and second elements. For a wafer that is opaque, light projected from the first element is blocked by the wafer if the wafer is present. If the wafer is absent, the projected light is received by the second element. In the case of a transparent wafer, light projected from the first element and reflected by the wafer (if the wafer is present) is received by the photoreceptor surface of the first element. If the wafer is absent, light does not impinge upon the photoreceptor surface of the first element. This is premised on the fact that whether the wafer is a transparent wafer or an opaque wafer is known beforehand. The photoreception signal of the first element and the photoreception signal of the second element are switched, depending upon the type of wafer, before being applied to a discriminating circuit.

This wafer sensor requires the first element having the light-emitting and photoreceptor surfaces. In the case of a transparent wafer, the sensor receives the light reflected from the wafer and therefore is readily influenced by the surface of the wafer. The wafer type, i.e., transparent or opaque, must be known in advance.

In the wafer sensors of all of the above-mentioned types, a light-projecting (light-emitting) element and a photoreceptor element must be inserted in the gaps between wafers. There has been a tendency in recent years for the gaps between the multiplicity of wafers held in the wafer cassette to be made smaller. There is a limit upon the extent to which the thickness of the light-projecting and photoreceptor elements and the thickness of the members for holding these elements can be reduced.

There are occasions where the wafers in a semiconductor process become charged with static electricity. If this static electricity discharges through electrically conductive portions of the light-projecting and photoreceptor elements inserted between the wafers, there is the danger that this may lead to erroneous detection and destruction of the light-projecting and photoreceptor elements.

DISCLOSURE OF THE INVENTION

An object of the present invention is to provide a transmission-type photoelectric sensor, multiple transmission-type photoelectric sensor and photoelectric sensing method capable of sensing both opaque and transparent bodies (inclusive of semi-transparent bodies).

Another object of the present invention is to provide a structure whereby a sensing portion inserted between objects to be sensed can be made as thin as possible.

A further object of the present invention is to provide a structure whereby the influence of static electricity that has charged an object to be sensed can be made as small as possible.

Still another object of the present invention is to provide a structure whereby the number of light-projecting and photoreceptor elements can be made as small as possible.

A multiple transmission-type photoelectric sensor according to the present invention is defined as follows when expressed all-inclusively: Specifically, a multiple transmission-type photoelectric sensor according to the present invention has a plurality of sensing arms provided in spaced-apart relation on a sensor case so as to extend outwardly of the case, and a plurality of light-projecting elements and a plurality of photoreceptor elements provided inside the sensor case, one light-projecting element, one photoreceptor element or one pair of the light-projecting and photoreceptor elements corresponding to each sensing arm, a distal end of each sensing arm being provided with at least one of a first deflecting member for directing projected light from the corresponding light-projecting element toward a neighboring sensing arm and a second deflecting member for directing projected light from the neighboring sensing arm toward the corresponding photoreceptor element.

In one embodiment, one pair of the light-projecting and photoreceptor elements corresponds to each sensing arm, and each sensing arm is provided with the first deflecting member and the second deflecting member. In another embodiment, one light-projecting element or one photoreceptor element corresponds to each sensing arm, the distal end of the sensing arm that corresponds to the light-projecting element is provided with the first deflecting member, and the distal end of the sensing arm that corresponds to the photoreceptor element is provided with the second deflecting member.

In any case, the space between two neighboring sensing arms is a sensing area, projected light from the light-projecting element of one sensing arm reaches the neighboring other sensing arm by traversing the sensing area at least one time (two or more times depending upon the mode) and is received by the photoreceptor element of the one sensing arm or of the other sensing arm. By subjecting the photoreception signal of the photoreceptor element to level discrimination, at least the absence or presence of an object in the sensing area is determined.

In accordance with the present invention, a plurality of sensing arms are provided. As a result, a plurality of sensing areas are established and sensing operations can be performed simultaneously in these plurality of sensing areas. The distal end of each sensing arm need only be provided with a deflecting member (e.g., a reflecting surface, a prism, etc.); provision of a light-projecting element and photoreceptor element is not necessary. Accordingly, it is possible to reduce the thickness of the sensing arm so that the sensing arm can be applied to a narrow sensing area. In a case where the photoelectric sensor according to the present invention is used in sensing a wafer or the like, the fact that the distance between the wafer and the light-projecting and photoreceptor elements is great (a long distance can be set) means that even if the wafer becomes charged with static electricity, it is possible to prevent the light-projecting and photoreceptor elements and the sensing circuit from being adversely affected by this static electricity.

In a preferred embodiment, each sensing arm is provided with a third deflecting member for returning the projected light from the neighboring sensing arm to this neighboring sensing arm.

The projected light traverses the space (the sensing area) between neighboring sensing arms at least two times. Even if an object to be sensed is transparent or semi-transparent, the projected light passes through the object at least twice, as a result of which the amount of attenuation increases to make possible reliable detection of a transparent or semi-transparent object.

In another preferred embodiment, the first deflecting member directs the optical path of the projected light obliquely with respect to a direction in which the sensing arms are arrayed, and the second deflecting member directs the light, which has advanced obliquely with respect to the direction in which the sensing arms are arrayed, toward the photoreceptor element.

The projected light impinges upon the surface of the object within the sensing area obliquely and passes through the object obliquely. Since loss equivalent to the amount of reflection of the light that impinges obliquely upon the surface of the object is great, it is possible to sense the object reliably regardless of whether it is transparent or semi-transparent.

When the projected light passes through the object obliquely, the optic axis is displaced. It is preferred that the front side of the photoreceptor element be provided with a slit which limits the incident light in such a manner that the displacement of the optic axis can be sensed more noticeably. The amount of light that impinges upon the photoreceptor element varies greatly depending upon whether or not an object is present (even if the object is a transparent object) and the type of object, as a result of which more certain detection becomes possible.

The displacement of the optic axis can be sensed by a position sensing device and the absence or presence of an object and the type thereof can be determined based upon an output representing the position sensed by the position sensing device.

If the output representing the sensed position and a photoreception output are obtained from the position sensing device, these outputs are each discriminated by a predetermined threshold value and the results of discrimination are subjected to a logic operation, it is possible to sense an object much more reliably (as well as the type of object when necessary).

In yet another preferred embodiment, the first deflecting member splits the projected light from the light-projecting element into two portions and directs these two portions toward the neighboring sensing arms on both sides.

Since the projected light from one light-projecting element is split into two portions and propagates into two sensing areas, the number of light-projecting and photoreceptor elements can be reduced.

In order that objects to be sensed in a plurality of sensing areas may be sensed in time-shared fashion, there are provided drive means for driving a plurality of light-projecting elements sequentially at predetermined time intervals, and means for fetching, in sync with driving of the light-projecting element, a photoreception signal of a prescribed photoreceptor element which receives projected light from a light-projecting element that is driven. There is further provided decision means having at least one threshold value for discriminating an output signal of a photoreceptor element based upon this threshold value, thereby outputting a detection signal indicative of an object to be sensed.

There are a variety of threshold values. One is for distinguishing between absence of a transparent body and presence of a transparent body. A second is for distinguishing between absence of a semi-transparent body and presence of a semi-transparent body. A third is for distinguishing between a transparent body and a semi-transparent body. A fourth is for distinguishing between a transparent body and an opaque body. A fifth is for distinguishing between a semi-transparent body and an opaque body. A sixth is for distinguishing between absence or presence of an object. These threshold values may be combined appropriately.

In one embodiment, the sensing arms are provided with at least one of a first light guide for guiding projected light from a light-projecting element to the first deflecting member and a second light guide for guiding light from the second deflecting member to a photoreceptor element. Light can be guided reliably in the sensing arm and the effects of extraneous light can be reduced.

Preferably, the case is provided with at least one of a shield member covering the light-projecting element, a shield member covering the photoreceptor element, a shield member covering the space between the sensing arms, a shield member covering the entirety of the plurality of photoreceptor elements, and a shield member covering a circuit board on which the sensing circuit is provided. This furnishes a greatly enhanced static-electricity countermeasure.

A first type of single transmission-type photoelectric sensor (which can also be used in multiple-type configuration as a matter of course) according to the present invention has a light-projecting element and a photoreceptor element for receiving light that has traversed a sensing area upon being emitted by the light-projecting element, characterized by having: a first deflecting member for bending, approximately at right angles, projected light from the light-projecting element to direct the projected light toward the sensing area; a second deflecting member for bending, approximately at right angles, light from the sensing area to direct the projected light toward the photoreceptor element; and a third deflecting member for directing the light, which has been introduced by the first deflecting member and has traversed the sensing area, toward the second deflecting member via the sensing area again.

Preferably, the third deflecting member includes two deflecting members for bending incident light approximately at right angles and directs light, which is approximately parallel to the light introduced to the sensing area by the first deflecting member, toward the second deflecting member.

Projected light from the light-projecting element is directed from the first deflecting member to the third deflecting member through the sensing area, advances from the third deflecting member to the second deflecting member through the sensing area again and arrives at the photoreceptor element.

The arrangement is such that the projected light traverses the sensing area at two or more times. As a result, if a transparent or semi-transparent body is present in the sensing area, the projected light passes through the transparent or semi-transparent body at least two times. Since the amount of attenuation of the projected light is increased, even a transparent body (or semi-transparent body) can be sensed with certainty. Since the arrangement is such that the projected light arrives at the photoreceptor element upon being deflected approximately at right angles by the first deflecting member and deflected approximately at right angles by the second deflecting member, the projected light does reach the photoreceptor element directly. This makes it possible to prevent erroneous detection due to reflection or the like.

The first type of transmission-type photoelectric sensor can be used in a multiple-type configuration as well. In such case it is preferred that the photoelectric sensor include at least two, namely first and second, sensing arms disposed so as to oppose each other across a sensing area defined therebetween. The first sensing arm has, at a distal end thereof, a first deflecting member for deflecting projected light from a light-projecting element, which projected light is introduced from a base end of the first sensing arm and advances along the longitudinal direction of the arm, in a direction approximately perpendicular to the longitudinal direction of the arm, thereby directing the light toward the sensing area; and, at the distal end thereof, a second deflecting member for deflecting light from the sensing area in a direction approximately at right angles, causing the light to advance along the longitudinal direction of the arm and introducing the light to the photoreceptor element. The second sensing arm has a third deflecting member for causing light, which has advanced from the first deflecting member via the sensing area, toward the second deflecting member via the sensing area again.

A photoelectric sensing method according to the present invention can be expressed as follows: Specifically, a photoelectric sensing method according to the present invention includes causing light from a light-projecting element to advance to a sensing area upon being deflected approximately at right angles, directing the light, which has traversed the sensing area, toward the sensing area again to thereby cause the light to traverse the sensing area at least two times, introducing the light, which has traversed the sensing area at least two times, to a photoreceptor element upon deflecting the light approximately at right angles, and sensing an object, which is present in the sensing area, based upon an output signal from the photoreceptor element.

A second type of transmission-type photoelectric sensor has at least first and second sensing arms disposed so as to oppose each other across a sensing area defined therebetween. The first sensing arm has, at a distal end thereof, a first deflecting member for deflecting projected light from a light-projecting element, which projected light is introduced from a base end of the first sensing arm and advances along the longitudinal direction of the arm, in a direction that is approximately perpendicular to the longitudinal direction of the arm and oblique with respect to a direction in which the first and second sensing arms are arrayed, thereby directing the light toward the sensing area. The second sensing arm has, at a distal end thereof, a second deflecting member for deflecting light, which has advanced from the first deflecting member of the first sensing arm obliquely through the sensing area, in an approximately perpendicular direction, causing the light to advance along the longitudinal direction of the arm and introducing the light to a photoreceptor element.

The arrangement is such that the projected light crosses the sensing area obliquely. The projected light impinges obliquely upon the surface of an object to be sensed. Since loss due to reflection of the obliquely incident light is large, the fact that the difference in amount of light incident upon the photoreceptor element when an object to be sensed is and is not present is large makes it possible to sense the object with certainty, even if the object to be sensed is transparent (or semi-transparent).

In a preferred embodiment, both the first sensing arm and the second sensing arm are provided with the first and second deflecting members.

Preferably, the front side of the photoreceptor element is provided with a slit which limits the incident light. The photoreceptor element may be a position sensing device.

A third type of transmission-type photoelectric sensor includes a first sensing arm, and second and third sensing arms disposed on respective ones of both sides of the first sensing arm across sensing areas defined therebetween. The first sensing arm has, at a distal end thereof, a first splitting and deflecting member for splitting, into two portions, projected light from a light-projecting element, which projected light is introduced from a base end of the first sensing arm and advances along the longitudinal direction of the arm, deflecting these split portions of light approximately at right angles, and directing these split portions of light toward the sensing areas on both sides. The second and third sensing arms respectively have, at respective distal ends thereof, second and third deflecting members, respectively, for deflecting light, which has advanced from the first splitting and deflecting member through the sensing area, approximately at right angles, causing the light to advance along the longitudinal direction of the arm and introducing the light to photoreceptor elements.

Projected light from one light-projecting element is split into two portions by the first splitting and deflecting member and advances into the two sensing areas. The two beams of light that have traversed these sensing areas are deflected by respective ones of the second and third deflecting members and are received by respective ones of separate photoreceptor elements. Sensing in regard to objects in two sensing areas is possible by a single light-projecting element, thereby reducing the number of elements. In a case where this photoelectric sensor is applied to a multiple-type configuration, the numbers of light-projecting elements and photoreceptor elements can be reduced greatly.

BEST MODE FOR CARRYING OUT THE INVENTION

First Embodiment

Figure 1:
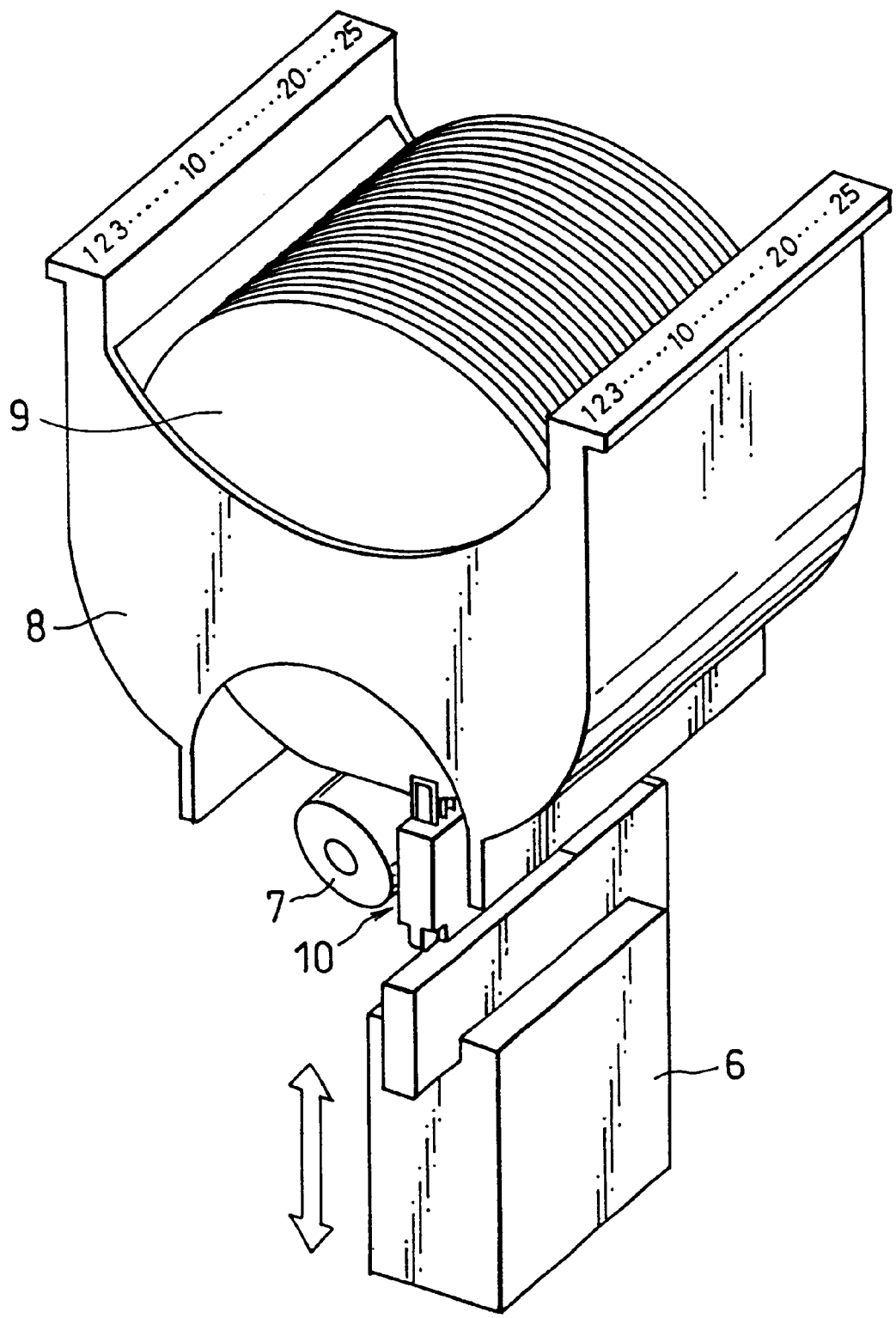
FIG. 1 is a perspective view showing the manner in which a wafer sensor is used to sense wafers in a wafer cassette.

FIG. 1 illustrates the manner in which a multiplicity of wafers 9 are held in a wafer cassette (or wafer carrier) 8 in a process for manufacturing a semiconductor device. The wafer cassette 8 has two side walls formed so as to approach each other as the bottom of the cassette is approached, the bottom having an opening. The inner surface of each of the two side walls of wafer cassette 8 is formed to have a multiplicity of vertically extending retaining grooves (not shown) at prescribed intervals. Each wafer 9 is held in the retaining groove so as to be free to move up and down and free to rotate. The spacing between the wafers 9 is decided by the spacing between the retaining grooves. An alignment roller 7 rotates the wafers 9 inside the cassette 8 to align the wafers (adjust their attitude) in an alignment part of the manufacturing process. For example, the wafers are aligned in such a manner that orientation flats on all of the wafers 9 will be situated at the bottom.

Figure 2:
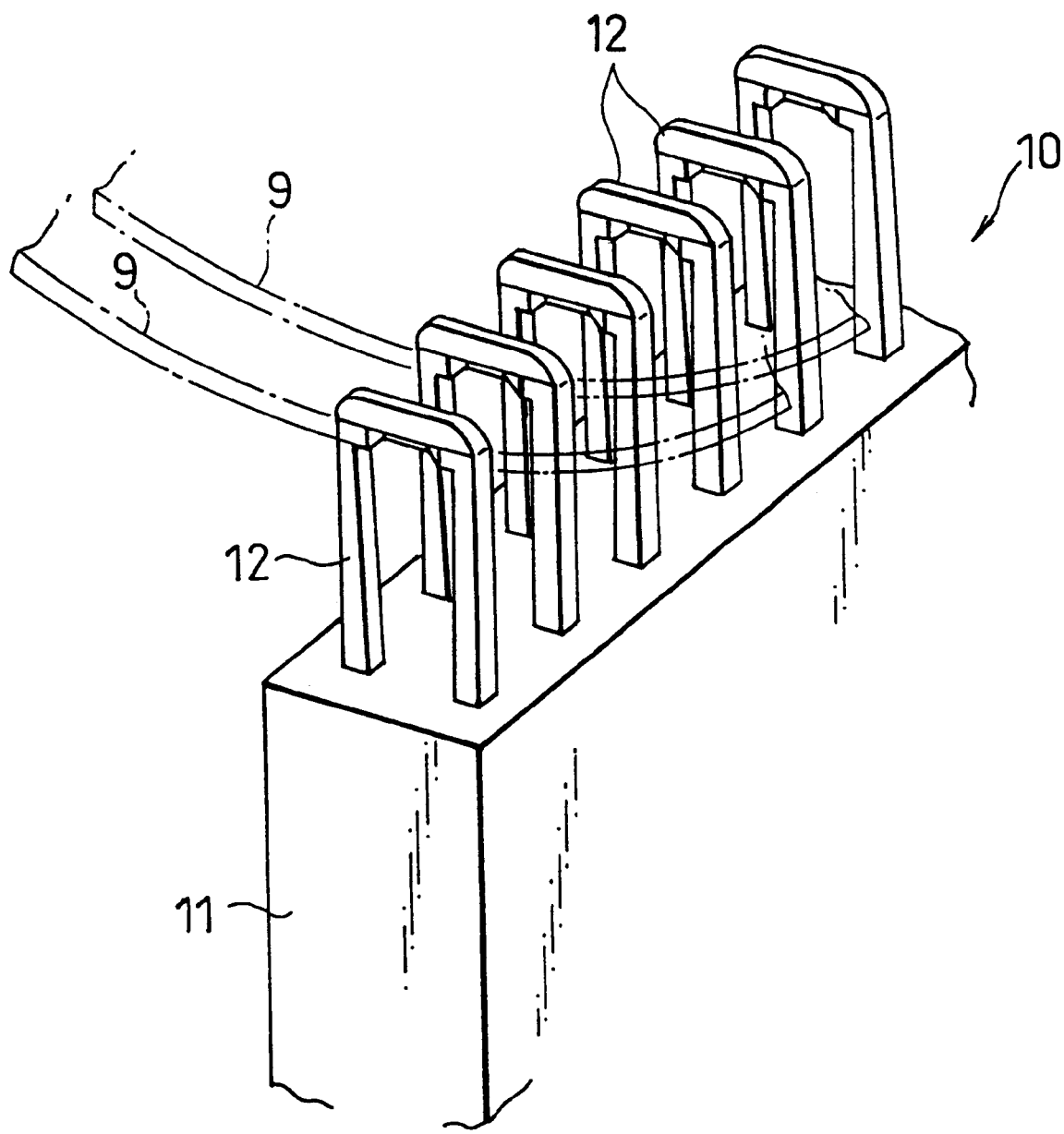
FIG. 2 is a perspective view showing a part of the wafer sensor in enlarged form.

As shown in FIG. 2, a wafer sensor 10 includes a sensor case 11 and a multiplicity of sensing arms 12 arrayed on the top side of the case at prescribed intervals. The sensing arms 12 project upwardly from the top side of the sensor case 11. The intervals of the sensing arms 12 and the intervals of the wafers 9 held in the wafer cassette 8 are equal.

The wafer sensor 10 is provided on an elevator base 6 and is raised by raising the elevator base 6 so that the sensing arms 12, with the exception of those at both ends, enter the spaces between the wafers 9 on one side of the alignment roller 7. In other words, each wafer 9 is interposed between two neighboring sensing arms 12.

As will become clear from a detailed description given later, each sensing arm 12 constructs part of a transmission-type photoelectric sensor. The wafer sensor 10 senses whether wafers are contained in the wafer cassette 9, the number thereof, etc. The wafer sensor 10 is subsequently lowered and the wafer cassette 9 is sent to the next process.

Figure 3:
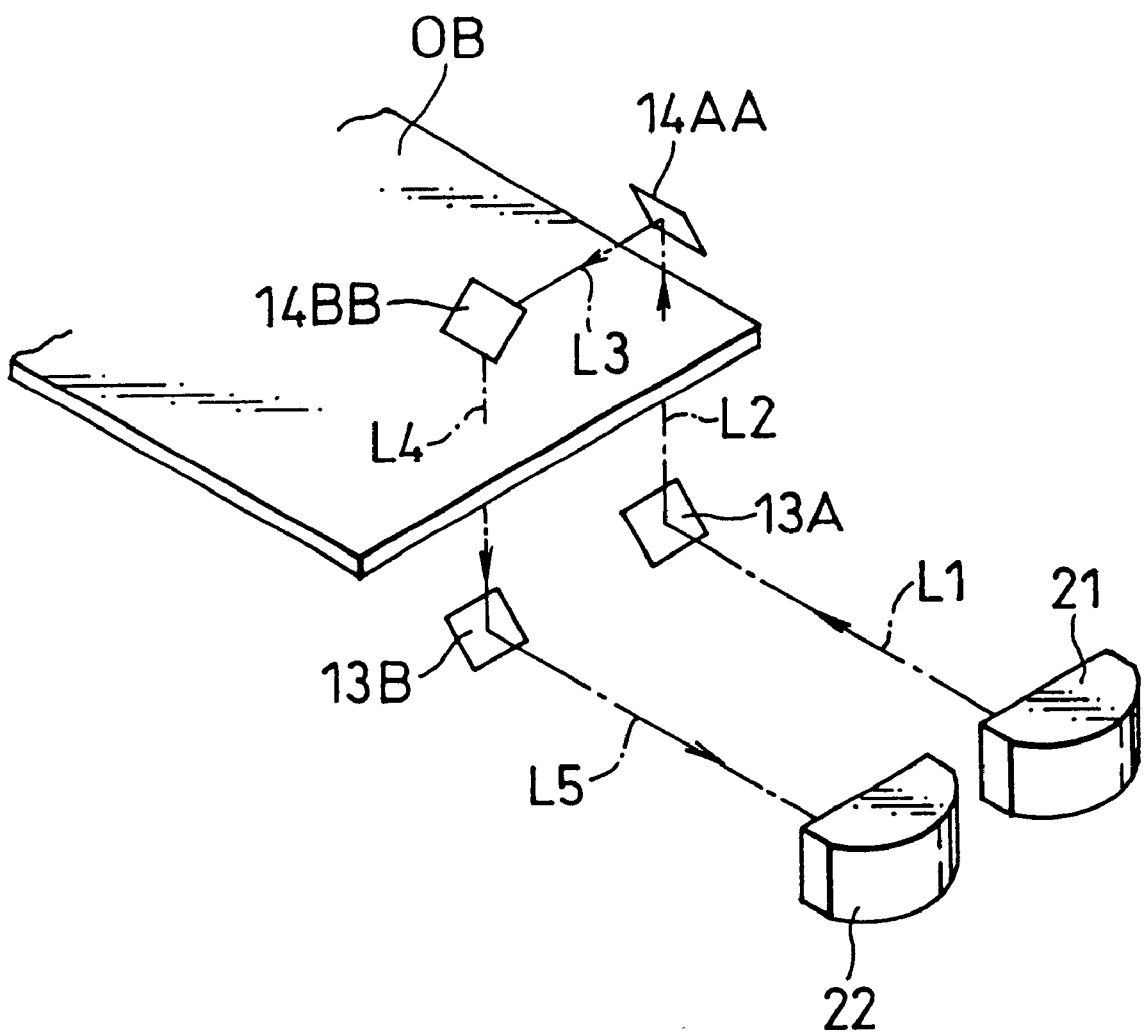
FIG. 3 illustrates the sensing principle of a wafer sensor according to a first embodiment.

FIG. 3 illustrates the sensing principle of the wafer sensor 10 (the transmission-type photoelectric sensor or a multiple transmission-type photoelectric sensor). Though the above-mentioned wafer can be cited as one example of an object to be sensed, various other objects can be adopted irrespective of whether they are opaque, transparent or semi-transparent. For the sake of convenience in terms of explanation, an object OB is assumed to be transparent (or semi-transparent).

A light-projecting element 21 and a photoreceptor element 22 are disposed side by side with a space between them. The optic axes of the light-projecting element 21 and photoreceptor element 22 are parallel (or approximately parallel). Four reflecting surfaces (e.g., mirror surfaces or mirrors) are disposed as follows in relation to the object OB in order to form optical paths L1, L2, L3, L4 and L5 along which projected light emitted by the light-projecting element 21 arrives at the photoreceptor element 22:

The light-projecting element 21 includes a projecting lens (not shown) (or a projecting lens is provided in front of the light-projecting element 21) so that projected light that has been collimated will be emitted from the light-projecting element 21. The projected light advances along the optic axis of the light-projecting element 21 (optical path L1) and is reflected by a reflecting surface 13A so as to be directed along the optical path L2. The optical path L2 is perpendicular (or approximately perpendicular) to a plane (referred to as a "reference plane" below) containing the optic axis (optical path L1) of light-projecting element 21 and the optic axis (optical path L5) of photoreceptor element 22. The projected light which advances along the optical path L2 impinges upon the object OB perpendicularly (or approximately perpendicularly).

The light that has impinged upon the object OB is attenuated slightly in the process of passing through the object OB. The light that has passed through the object OB is reflected again by a reflecting surface 14AA so that the optical path thereof is bent at right angles (or approximately right angles). The optical path L3, which is perpendicular (or approximately perpendicular) to the optical path L2 lies parallel (or approximately parallel) to the reference plane. The light which advances along the optical path L3 is reflected further by a reflecting surface 14BB so as to advance along the optical path L4. The optical path L4 is perpendicular (or substantially perpendicular) to the optical path L3 and parallel (or substantially parallel) to the optical path L2.

The light which advances along the optical path L4 impinges upon the object OB again. The light is attenuated slightly in the process of passing through the object OB. The light that has passed through the object OB is reflected again by a reflecting surface 13B so that the light is directed toward the photoreceptor element 22 along the optical path L5, condensed by a photoreceptor lens (not shown) and caused to impinge upon the photoreceptor element 22.

The result is that the projected light passes through the object OB twice. The optical paths L2 and L4 are the optical paths of light that traverses a sensing area. The plane defined by the optical paths L2 and L4 is perpendicular (or substantially perpendicular) to the reference plane. In a case where the object OB is planar, it is preferred that the object OB be placed parallel (or approximately parallel) to the reference plane.

Even if the object OB is a transparent body, its transmittance is not 100% and light is attenuated upon passing through the object OB. Since the projected light passes through the object OB twice, the attenuation of the light is increased as compared with transmission through the object once.

By way of example, assume that the transmittance of a transparent wafer is 92%. Assume that the amount of light received by the photoreceptor element 22 (the level of the photoreception signal) when an object to be sensed (the transparent wafer) is not present is 100. Since the projected light passes through the transparent wafer twice, the amount of light received by the photoreceptor element 22 is 100×0.92×0.92=84.6. By setting a threshold value in the vicinity of 90 and comparing the amount of light received by the photoreceptor element 22 with this threshold value, whether or not the transparent wafer is present can be sensed. When an opaque wafer is present as the object OB, the projected light led along the optical path L2 is interrupted by the opaque wafer in the sensing area and the amount of light received by the photoreceptor element 22 becomes approximately zero. If two values, e.g., 60 and 90, are set as threshold values, it is possible to perform sensing that distinguishes between presence of a transparent wafer and presence of an opaque wafer. It is judged that an opaque wafer is present if the amount of received light is less than 60, that a transparent wafer is present if the amount of received light is 60 or greater but less than 90, and that a wafer is absent if the amount of received light is 90 or greater. Thus, not only the absence or presence of a wafer but also the type of wafer can be determined. In addition to transparent and opaque wafers, it is possible to identify and sense semi-transparent wafers as well in the same way. It will suffice to previously determine the amount of light received by the photoreceptor element when light has passed through a semi-transparent wafer twice, and set three different threshold values.

It is preferred that the two parallel optical paths L2 and L4 be formed at spaced-apart positions in the sensing area. The reason for this is as follows: The surface of an opaque wafer generally is a mirror surface. If the two optical paths L2 and L4 were close together, therefore, the projected light from the light-projecting element 21 would be positively reflected by the surface of the wafer and reach the photoreceptor element 22 via the reflecting surface 13B when the projected light impinges upon the wafer upon being reflected by the reflecting surface 13A and advancing along the optical path L2. In this case the amount of light received by the photoreceptor element 22 would exceed the threshold value 90 and there is the danger that the wafer would be sensed erroneously as being absent despite the fact that it is present.

Setting the optical paths L2 and L4 perpendicular (or approximately perpendicular) to the surface of the wafer also is for the purpose of assuring that light reflected by the surface of the wafer will not impinge upon the photoreceptor element 22. The reason for this is that if the projected light impinges upon the surface of the wafer perpendicularly, the reflected light, even if it returns to the reflecting surface 13A or light-projecting element 21, will not be directed toward the reflecting surface 13B or photoreceptor element 22.

Further, the reason for forming the optical paths L2 and L4 perpendicular (or approximately perpendicular) to the reference plane in the sensing area is to assure that reflected light, which is the result of the projected light being reflected by the surface of the wafer, will not return to the photoreceptor element 22 directly.

In accordance with the sensing principle described above, the sensing arm 12 is formed to have the reflecting surfaces 13A, 13B and reflecting surfaces 14A, 14B (which correspond to reflecting surfaces 14AA, 14BB) for reflecting light from the sensing arm neighboring on one side. The reflecting surfaces 14AA and 14BB are formed as the reflecting surfaces 14A, 14B on the sensing arm neighboring on the other side. The sensing arm 12 penetrates the space between wafers 9 and two neighboring sensing arms 12 sandwich a wafer 9 between them. The optical paths L2, L4 along which light passes through the wafer 9 twice are formed between two sensing arms 12. Since the spacing between the wafers 9 is small, the sensing arm 12 has a thin, plate-like shape so that it can penetrate this narrow space.

The details of construction of the sensing arm 12 will now be described with reference to FIGS. 4 to 8.

The sensing arm 12 is constituted by an arm frame 15 and a mounting piece 16. These are formed integrally from black, opaque resin (an insulating resin). The base portion of the arm frame 15 indicated by line A—A and the mounting piece 16 are inserted into a recess or hole in the sensor case 11, whereby the sensing arm 12 is mounted with its arm frame 15 projecting outwardly from the case 11.

The mounting piece 16 is formed to have two element accommodating recesses 17, 18. The light-projecting element 21 comprises a light-emitting diode (LED), for example, and a projecting lens provided in front of light-emitting surface of the light-emitting diode. The light-projecting element 21 is press-fitted into the recess 17 and held in the recess 17. The photoreceptor element 22, which is a photodiode, is press-fitted into and held in the accommodating recess 18 in a state in which it is housed within a shield case 23 consisting of an electrically conductive material. The shield case 23 covers the photoreceptor element 22 except for its photoreceptor surface and leads. The front sides of the accommodating recesses 17, 18 (the sides facing the arm frame 15) are provided with light-projecting and photoreceptor windows, respectively. The light-projecting surface of the light-projecting element 21 and the photoreceptor surface of the photoreceptor element 22 accommodated within the recesses 17, 18, respectively, are faced toward the light-projecting window and photoreceptor window, respectively.

The arm frame 15 is constituted by two members 15A, 15B extending in parallel, and a member 15C connecting the distal ends of the members 15A and 15B. Light from the light-projecting element 21, which is accommodated within the recess 17, emitted via the light-projecting window advances outwardly along the inner side of the member 15A (this is optical path L1). Further, light which advances inwardly along the inner side of the member 15B (optical path L5) is received by the photoreceptor element 22, which is inside the recess 18, from the photoreceptor window of the recess.

Figure 4:
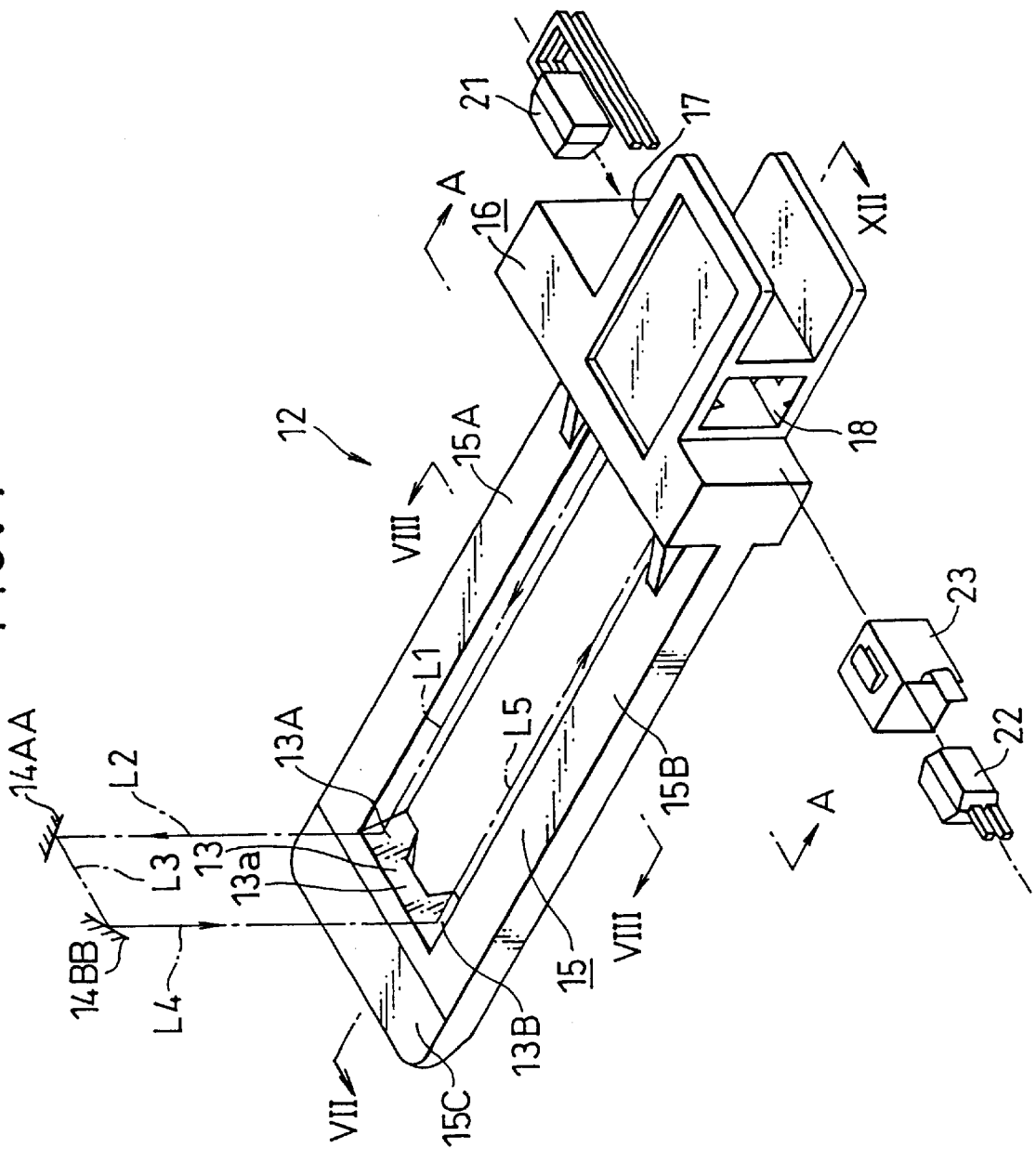
FIG. 4 is a perspective view of a sensing arm according to the first embodiment as seen from the front.
Figure 5:
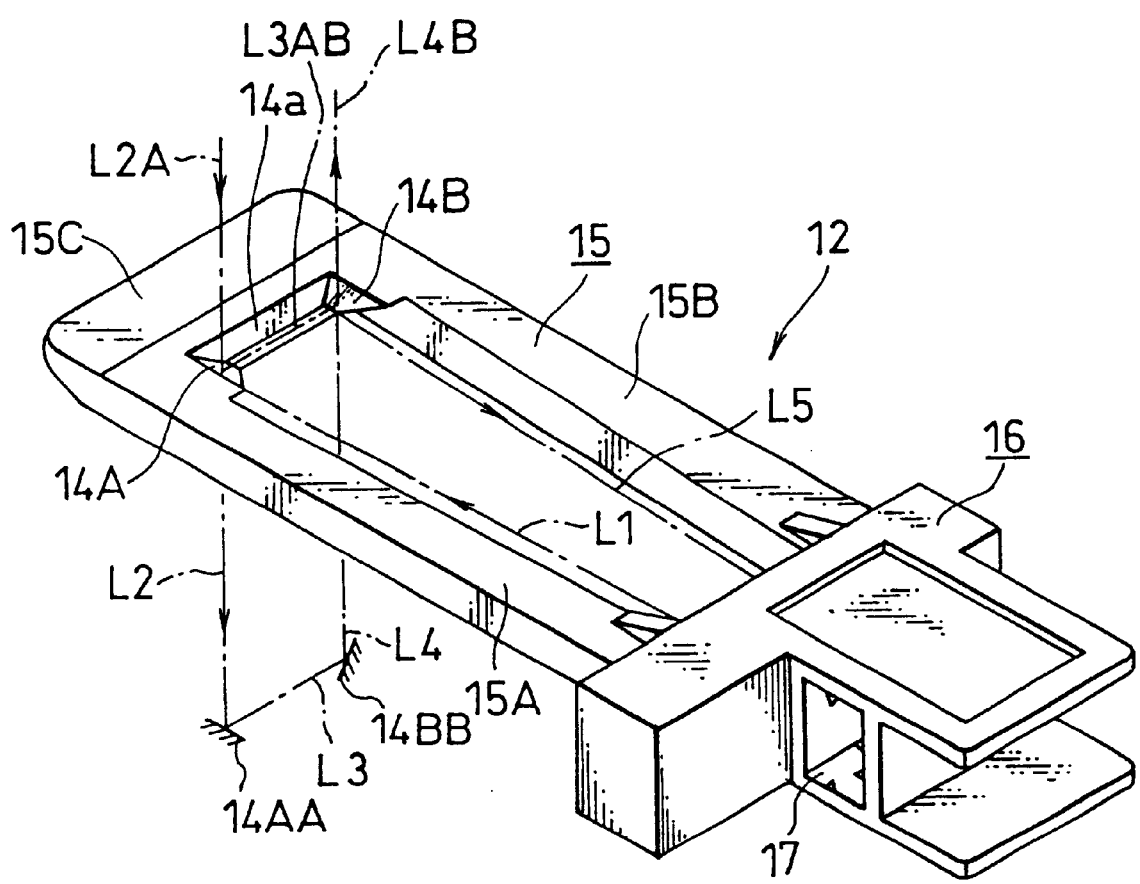
FIG. 5 is a perspective view of a sensing arm according to the first embodiment as seen from the back.
Figure 6:
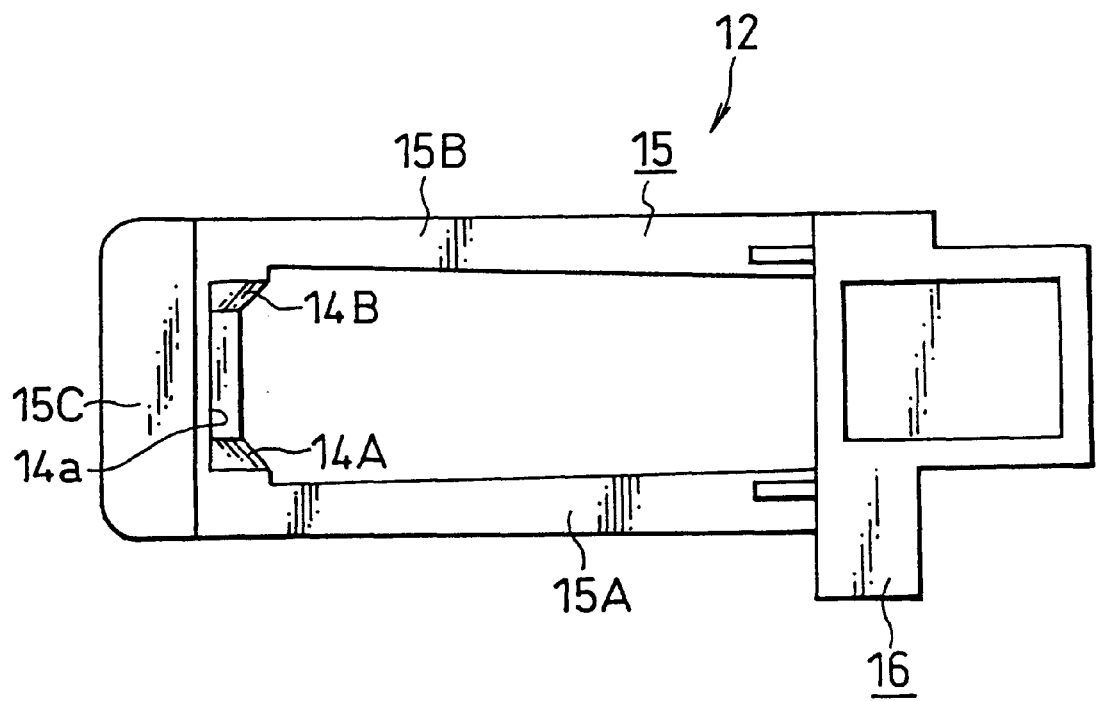
FIG. 6 is a back view of the same sensing arm.

FIGS. 4 and 5 are perspective views of the sensing arm 12 as seen from opposite sides thereof. For reasons of expediency in terms of explanation, the side seen in FIG. 4 shall be referred to as the front side and the side seen in FIG. 5 shall be referred to as the back side.

Figure 7:
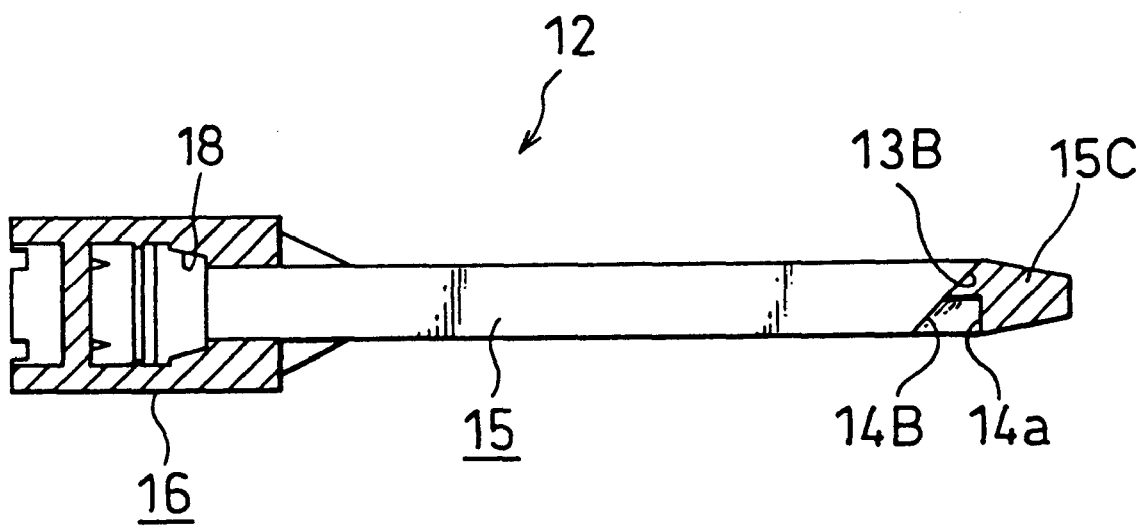
FIG. 7 is a sectional view of FIG. 4 taken along line VII—VII.
Figure 8:
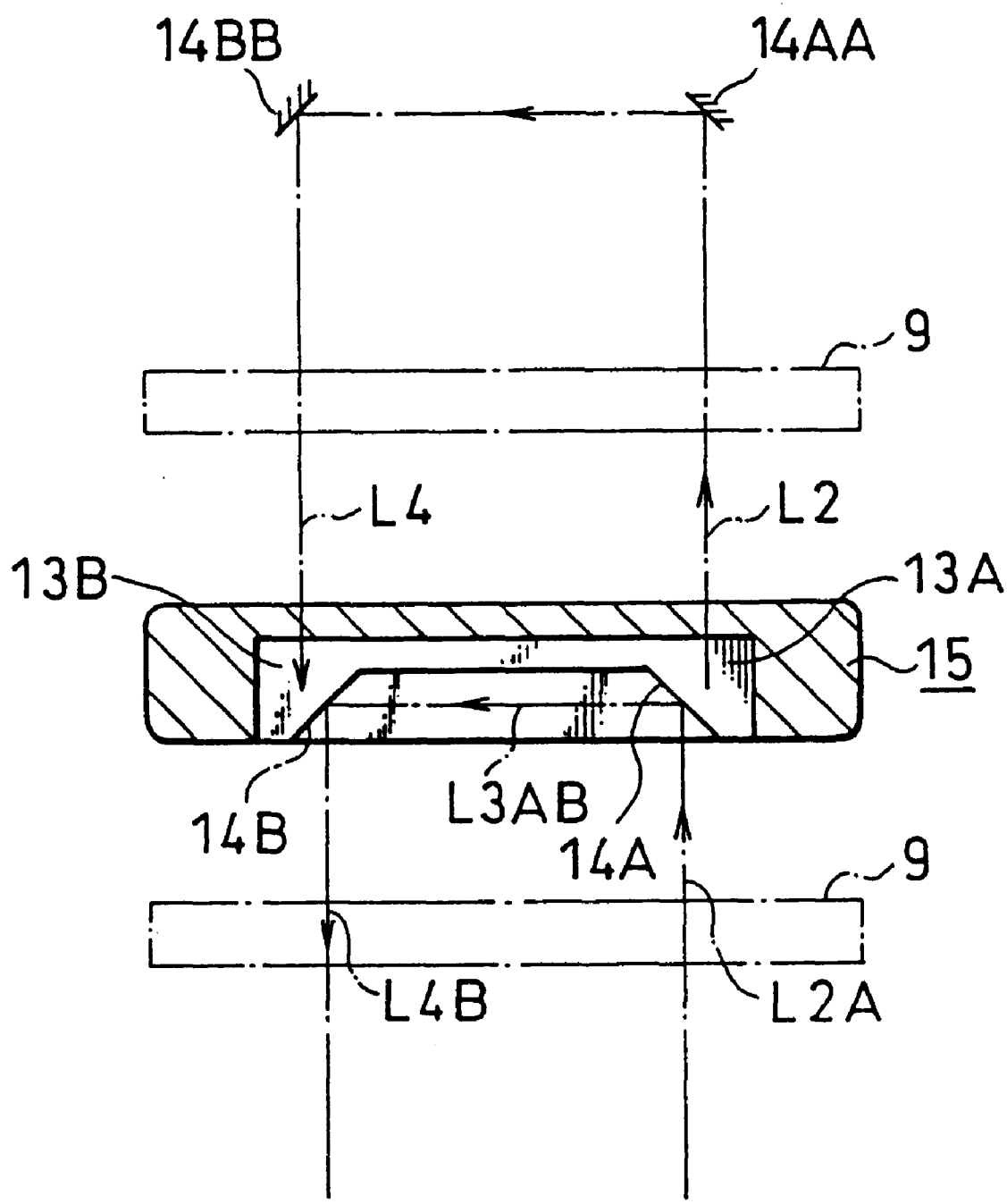
FIG. 8 is a sectional view of FIG. 4 taken along line VIII—VIII.

A reflecting member 13 is integrally formed on the inner side of the connecting member 15C of the arm frame 15 of sensing arm 12 so as to protrude from the connecting member. With reference particularly to FIGS. 4, 7 and 8, the reflecting member 13 is formed to have the two reflecting surfaces 13A, 13B, one on its left side and one on its right side, on the front side of the arm frame 15. The reflecting surfaces 13A, 13B are oblique surfaces which face the mounting piece 16 at an angle of 45°. Projected light (optical path L1) from the light-projecting element 21 is reflected by the reflecting surface 13A and directed toward the sensing area (wafer 9) along the optical path L2. Light impinging from the sensing area (wafer 9) along the optical path L4 is reflected by the reflecting surface 13B and directed along the optical path L5 so as to reach the photoreceptor element 22.

With reference particularly to FIGS. 5, 6, 7 and 8, the reflecting member 13 is formed to have the two reflecting surfaces 14A, 14B, one on its left side and one on its right side, on the back side of the arm frame 15. The reflecting surfaces 14A, 14B face each other and have an inclination of 45°. Light that has been reflected by the reflecting surface 13A of the neighboring sensing arm passes through the sensing area (wafer 9) and impinges upon the reflecting surface 14A along an optical path L2A (which corresponds to the above-mentioned optical path L2). This light is reflected by the reflecting surface 14A and impinge s upon the reflecting surface 14B via an optical path L3AB (which corresponds to optical path L3). The incident light is further reflected by the reflecting surface 14B and is directed toward the sensing area (wafer 9) along an optical path L4B (which corresponds to the optical path L4).

The reflecting surfaces 14A, 14B on the back side are formed on sides substantially opposite the reflecting surfaces 13A, 13B on the front side. The reflecting surfaces 13A, 13B, 14A, 14B can be formed by affixing mirrors to, or vapor-depositing a metal such as aluminum on, the reflecting member 13, which is formed from a black, opaque resin, at the positions of these reflecting surfaces. The reflecting surfaces 13A and 13B on the front side are connected by a member 13a of somewhat narrow width. The member 13a may or may not be a mirror surface, but it is better if it is not made a mirror surface. As a result, even if projected light from the light-projecting element 21 and light from the sensing area directed toward the photoreceptor element 22 should possess some spread, these light rays will be separated to make possible the elimination of stray light, which is a chief cause of malfunction. Similarly, it is better that a surface 14a (which is perpendicular to the front or back side of the arm frame 15) between the reflecting surfaces 14A and 14B also not be made a reflecting surface and be left as a black resin. Preferably, the surface 14a should be worked to reduce reflection or coated with a light-absorbing material.

Thus, as set forth above, the sensor case 11 is provided projectingly with the multiplicity of sensing arms 12, each sensing arm 12 is provided with a pair of light-projecting and photoreceptor elements 21, 22, the sensing arms 12 are caused to penetrate the spaces between the multiplicity of wafers 9 arrayed at fixed intervals, projected light from the light-projecting element 21 is directed from the distal end of the sensing arm 12 to the neighboring sensing arm, and this light is reflected by the neighboring sensing arm so as to return to the above-mentioned sensing arm and be received by the photoreceptor element 22. By adopting such an arrangement, the presence of a multiplicity of wafers can be sensed at one stroke.

Since the projected light passes through the wafer twice before being received by the photoreceptor element, it is possible to sense whether or not the wafers are present, regardless of whether the wafers are transparent or opaque (or semi-transparent), and to determine the type thereof (transparent, opaque, semi-transparent).

Since the sensing arm 12 need only be provided with members (the arm frame and reflecting surfaces) for guiding and reflecting light, the sensing arm can be made thin so that sensing arms can be applied to a group of wafers of small spacing.

Since the distance between the distal end of the sensing arm 12 inserted between the wafers 9 and the light-projecting and photoreceptor elements 21, 22 is comparatively long, the distance acts as an insulating distance. The structure is such that static electricity that has accumulated on the wafer 9 will not readily discharge through the light-projecting and photoreceptor elements 21, 22 or their circuits. Since the photoreceptor element 22 is shielded by the shield case 23, it will not readily be destroyed by discharge (the shield case 23 being grounded).

The surface of the portion (the arm frame 15) of the sensing arm 12 projecting from the case 11 desirably is subjected to a fluorine coating treatment. Chemicals often are used in the manufacture and machining of wafers. When a wafer sensor approaches the vicinity of a wafer to which strongly acidic chemicals have attached themselves, it is possible that these strongly acidic chemicals will attach themselves to the arm frame 15. Corrosion due to these strongly acidic chemicals can be prevented by the fluorine coating. Applying the fluorine coating hardens the surface of the arm frame 15. Even if a wafer or some other object should strike the sensing arm 12, chipping or cracking of the arm can be prevented.

In the above-described embodiment, the arm frame 15 and mounting piece 16 are integrally formed, but these can be made separate bodies. The arm frame 15 may be formed as an integral part of the case 11 only the mounting piece 16 may be mounted on the case 11. A plurality of mounting pieces can also be integrally formed.

The number of sensing arms 12 provided is one greater than the number of wafers 9 that are to be sensed at one stroke. For example, the wafer sensor 10 applied to the wafer cassette 8 capable of accommodating a maximum of 25 of the wafers 9 would be provided with 26 sensing arms 12. The light-projecting and photoreceptor elements 21, 22 would be provided on 25 of these sensing arms 12. Light-projecting and photoreceptor elements would not be required on the one sensing arm, situated on the outermost side, whose only role is to reflect and return projected light from the neighboring sensing arm.

Figure 9:
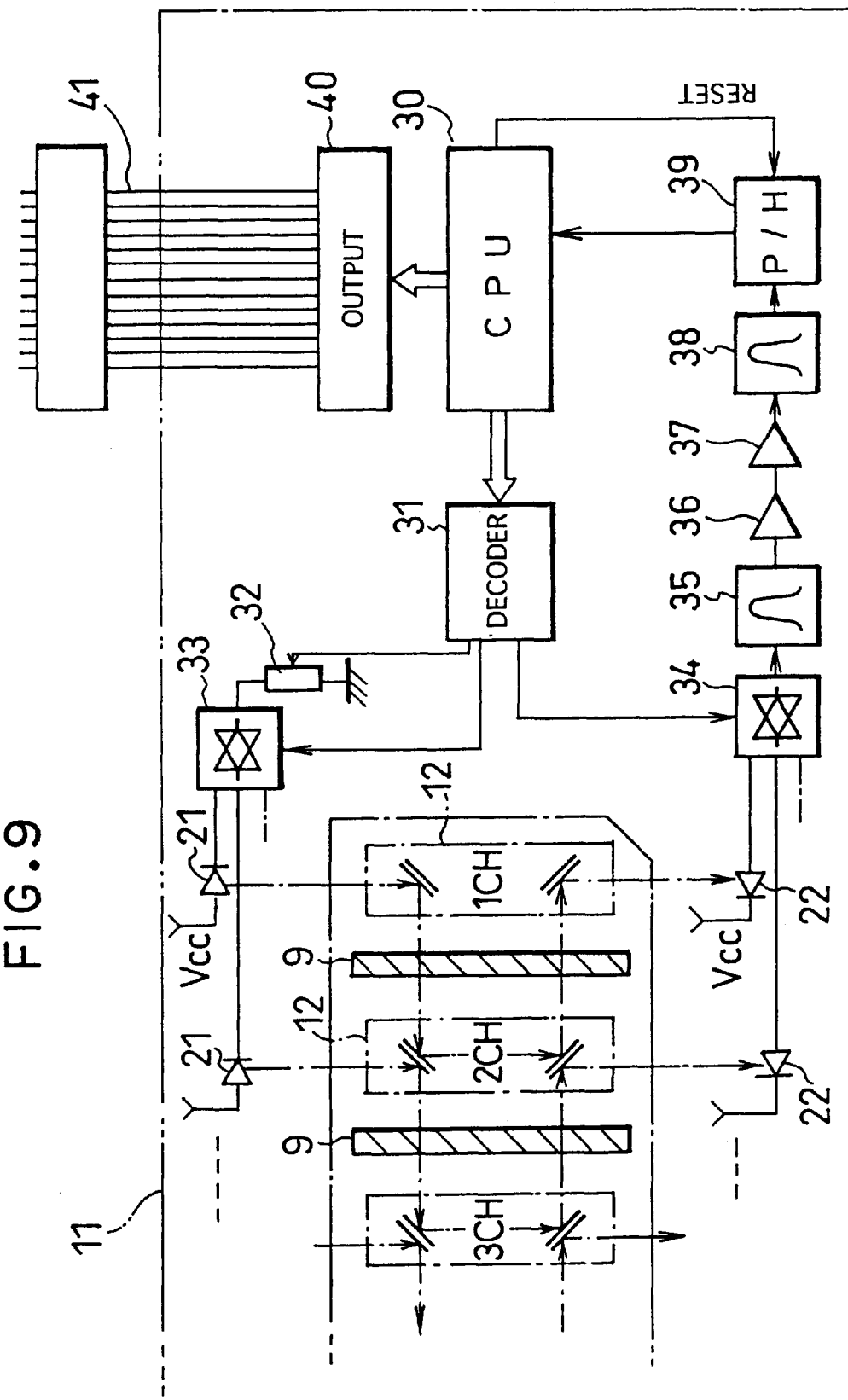
FIG. 9 is a block diagram showing a sensing circuit.
Figure 10:
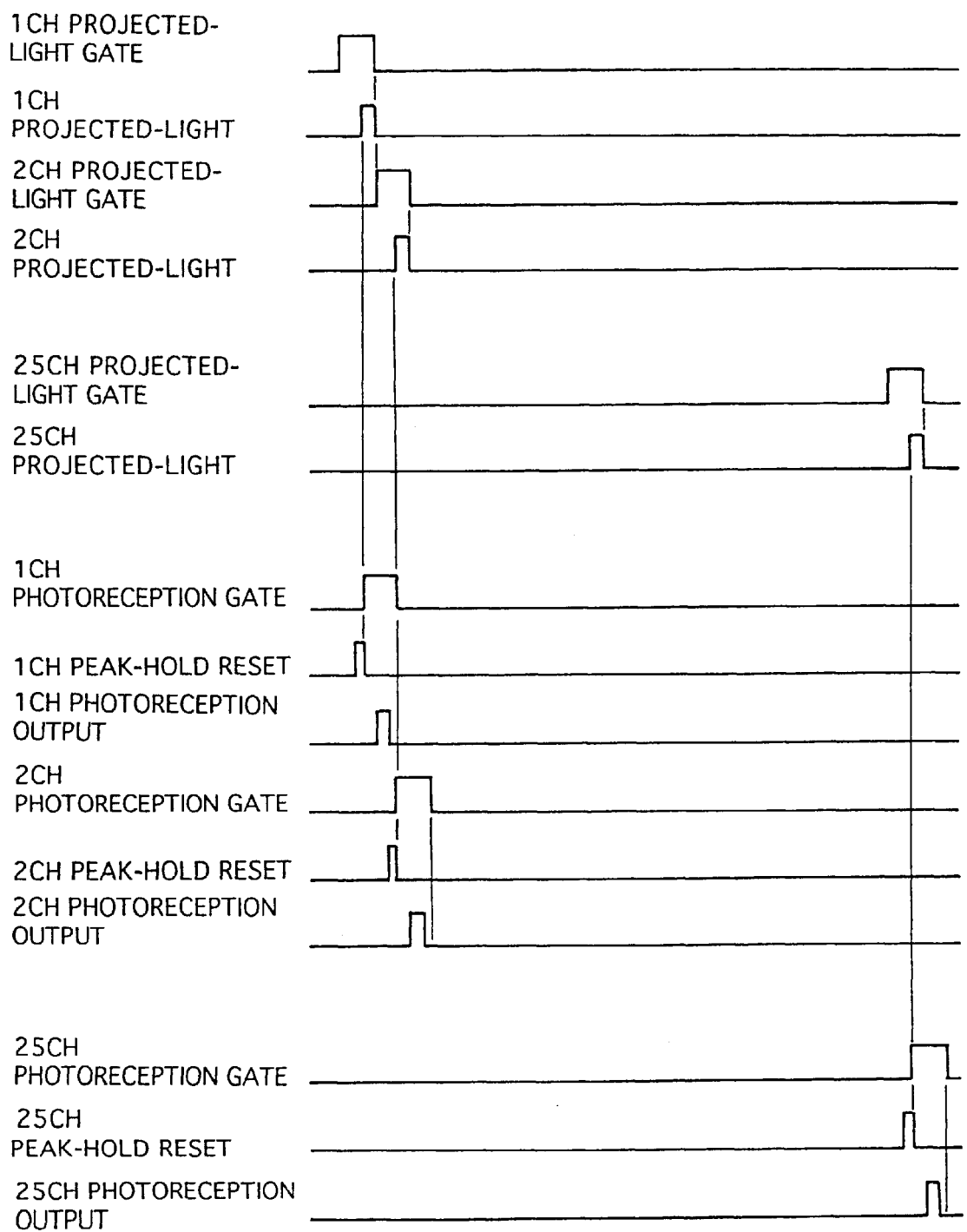
FIG. 10 is a time chart illustrating the operation of the sensing circuit.

A sensing circuit provided within the case 11 of the wafer sensor having such a construction is illustrated in FIG. 9, and the operating timing thereof is shown in FIG. 10. It will be assumed that 25 pairs of light-projecting and photoreceptor elements constitute respective channels from 1 to 25 (1CH to 25CH).

A CPU 30 controls the projection of light and the reception of light and executes decision processing based upon a photoreception output applied thereto.

The CPU 30 provides a decoder 31 with a signal that sequentially designates the light-projecting elements 21 of 25 channels at regular time intervals. The decoder 31 decodes the designating signal to open a gate that is provided in a projected-light switching circuit 33 and corresponds to the designated light-projecting element among the 25 light-projecting elements 21, and to drive a light-projection driver 32. As a result, the 25 light-projecting elements 21 are driven sequentially at regular time intervals and output projected light in sequential fashion. It goes without saying that it is so arranged that the drive times of the 25 light-projecting elements 21 will not overlap.

The decoder 31 further opens a gate of corresponding photoreceptor element 22, the gate being provided in a photoreception switching circuit 34. The gates are opened at a timing somewhat later than that at which the gates of the light-projecting elements 21 are opened. The gate of one photoreceptor element 22 is opened at regular time intervals, and only a photoreception signal from the photoreceptor element 22 is applied to a band-pass filter 35 through the photoreception switching circuit 34. The photoreception signal is applied to a peak-hold circuit 39 via the filter 35, a preamplifier 36, a main amplifier 37 and a comb filter 38. The comb filter 38 cuts low-frequency noise components. The peak-hold circuit 39 is reset at the timing at which a photoreceptor gate is opened. The signal held in the circuit 39 is accepted by the CPU 30 as a photoreception output before the gate of the next photoreception signal opens.

The CPU 30 judges whether a wafer is absent or present by comparing the levels of photoreception outputs successively accepted in this manner with a threshold value that has been set in advance. If threshold values having two or three levels are set, as mentioned above, the CPU 30 can determine the wafer type (opaque, semi-transparent or transparent) as well. Further, when necessary, the CPU 30 (acting as a wafer counter) counts the number of wafers present. Furthermore, the CPU 30 (acting as a wafer address sensor) generates an output indicating at what position a wafer is present (and the type of wafer).

Before wafer sensing processing is executed, light may be projected from the light-projecting element 21 in the absence of a wafer 9, this light may be received by the photoreceptor element 22, and a threshold value may be set or corrected, treating the photoreception output of the photoreceptor element 22 at this time as 100%.

The results of these decisions made by the CPU 30, or the output signals from the CPU 30, are output externally from an output circuit 40 via a cable 41. On the basis of these output signals, a controller controls a wafer treating apparatus, an apparatus for manufacturing semiconductor devices, etc. The case 11 may be provided with 25 indicator lamps which, by being lit, would indicate the absence or presence of the wafers on an individual basis. Modification A modification of the first embodiment will now be described.

Figure 11:
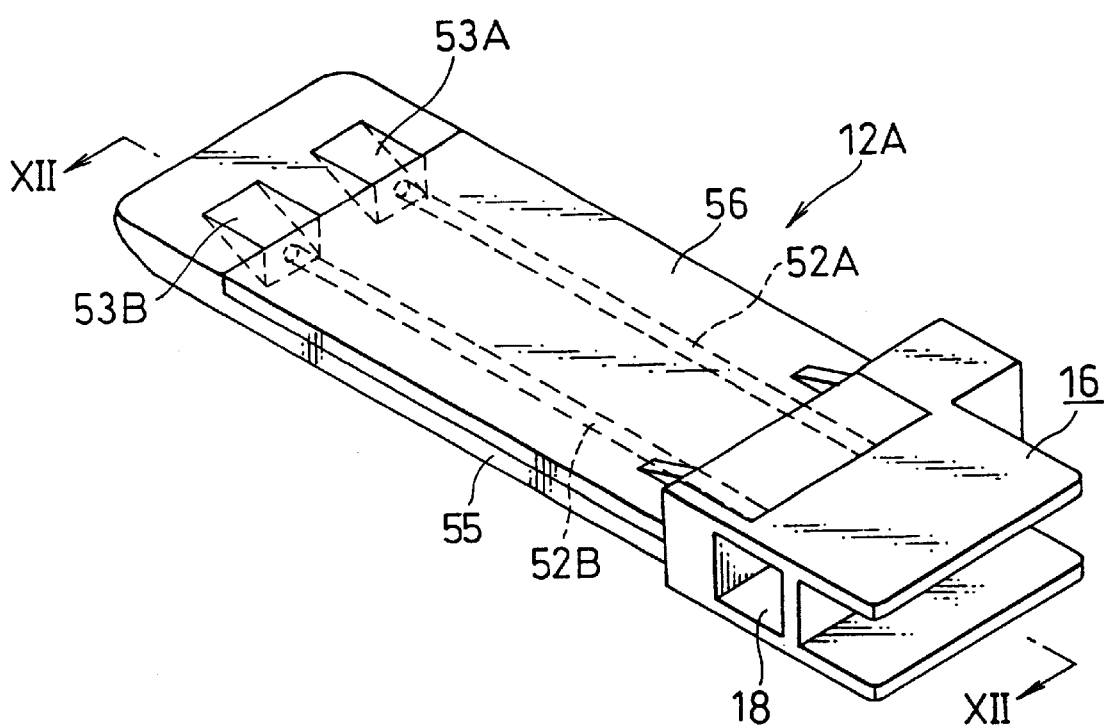
FIG. 11 is a perspective view of a sensing arm according to a first modification as seen from the front.
Figure 12:
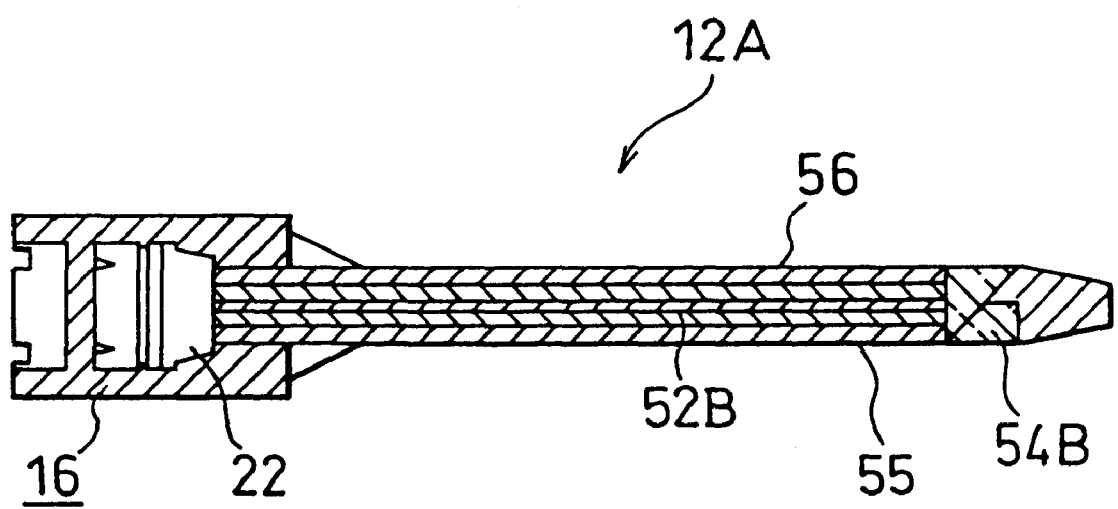
FIG. 12 is a sectional view of FIG. 11 taken along line XII—XII.
Figure 13:
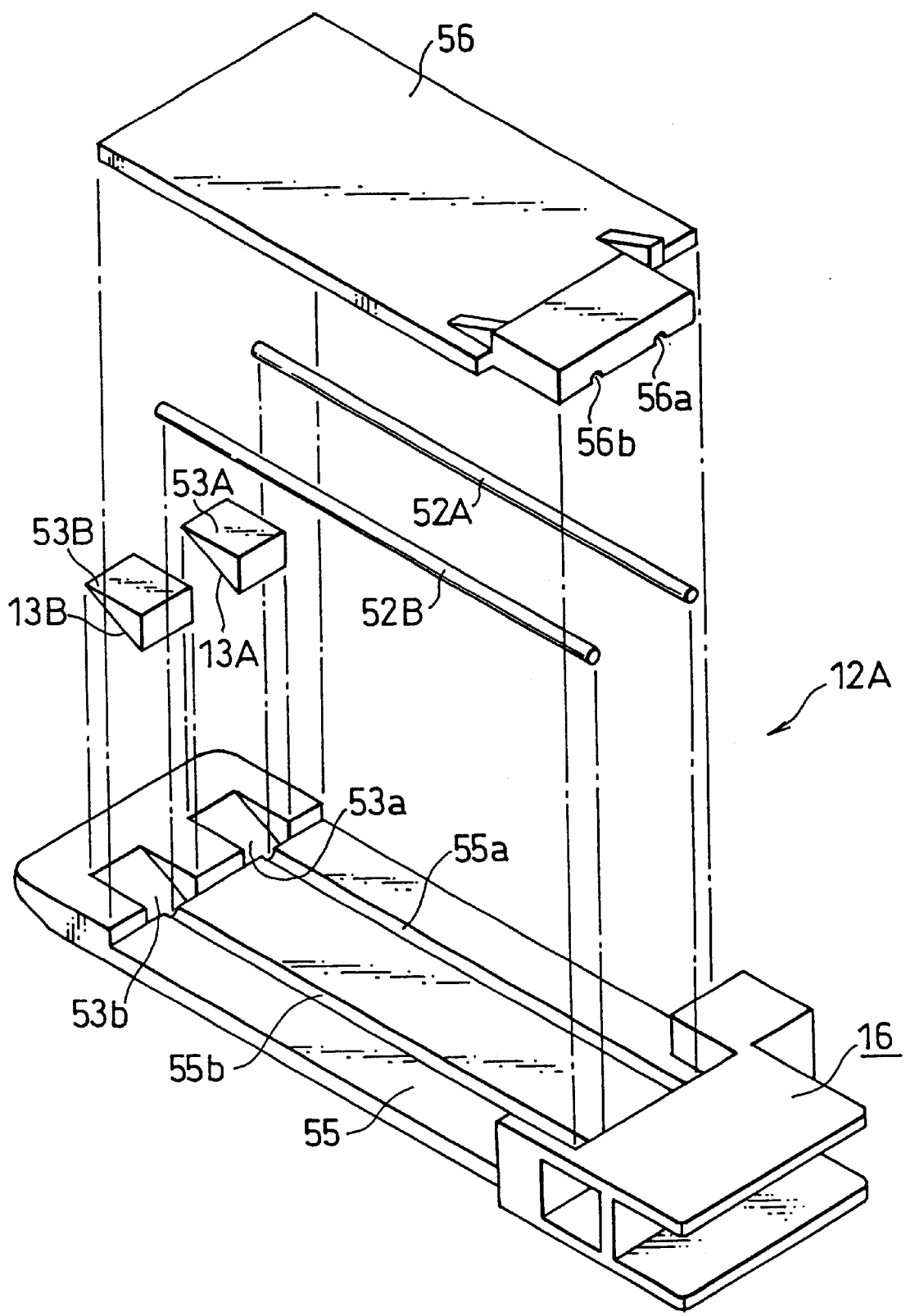
FIG. 13 is an exploded perspective view of the sensing arm according to the first modification.

FIGS. 11 to 13 illustrate a sensing arm 12A according to a first modification. The sensing arm 12A uses an optical fiber in order to guide light in the sensing arm 12A and employs a prism to deflect light. Light-projecting and photoreceptor elements are not shown.

The sensing arm 12A includes an arm base 55 formed as an integral part of the mounting piece 16, and a cover 56 of the arm base 55. The arm base 55 is formed to have a thickened distal end, which is formed to have recesses 53a, 53b in which prisms 53A, 53B, respectively, are accommodated. The inner surface of the arm base 55 and the inner surface of the cover 56 are formed to have grooves 55a, 55b, 56a, 56b with semi-circular cross sections for accommodating optical fibers 52A, 52B, respectively.

The cover 56 is bonded to the base 55 with the triangular prisms 53A, 53B accommodated in the recesses 53a, 53b of base 55 and the optical fibers 52A, 52B accommodated in the grooves 55a, 55b of base 55. The prisms 53A, 53B have oblique surfaces which act as the reflecting surfaces 13A, 13B. Projected light from the light-projecting element enters the prism 53A through the optical fiber 52A, is reflected by the reflecting surface 13A and is emitted into the sensing area outside. Light from the sensing area enters the prism 53B, is reflected by the reflecting surface 13B, enters the optical fiber 52B and arrives at the photoreceptor element through the optical fiber 52B.

The distal end of the base 55 has an underside which accommodates prisms (one prism 54B only is shown in FIG. 12) acting as the reflecting surfaces 14A, 14B.

The sensing arm 12A of the first modification has the following advantages: The arm frame 15 of the sensing arm 12 in the first embodiment has its central portion hollowed out. The sensing arm 12A of the first modification, however, does not possess a hollow space and therefore has a higher strength and is strongly resistant to external forces. The sensing arm 12A will not be easily damaged even if it strikes the wafer cassette. There is also no need for an aluminum vapor-deposition process for the purpose of forming the reflecting surfaces. Since light passes through the optical fibers 52A, 52B and prisms 53A, 53B, it is difficult for extraneous light to enter. This eliminates a cause of malfunction.

Lenses can be disposed between the optical fibers 52A, 52B and prisms 53A, 53B to collimate the projected light and condense light from the sensing area. Optical elements having a lens function can be used as the prisms.

Figure 14:
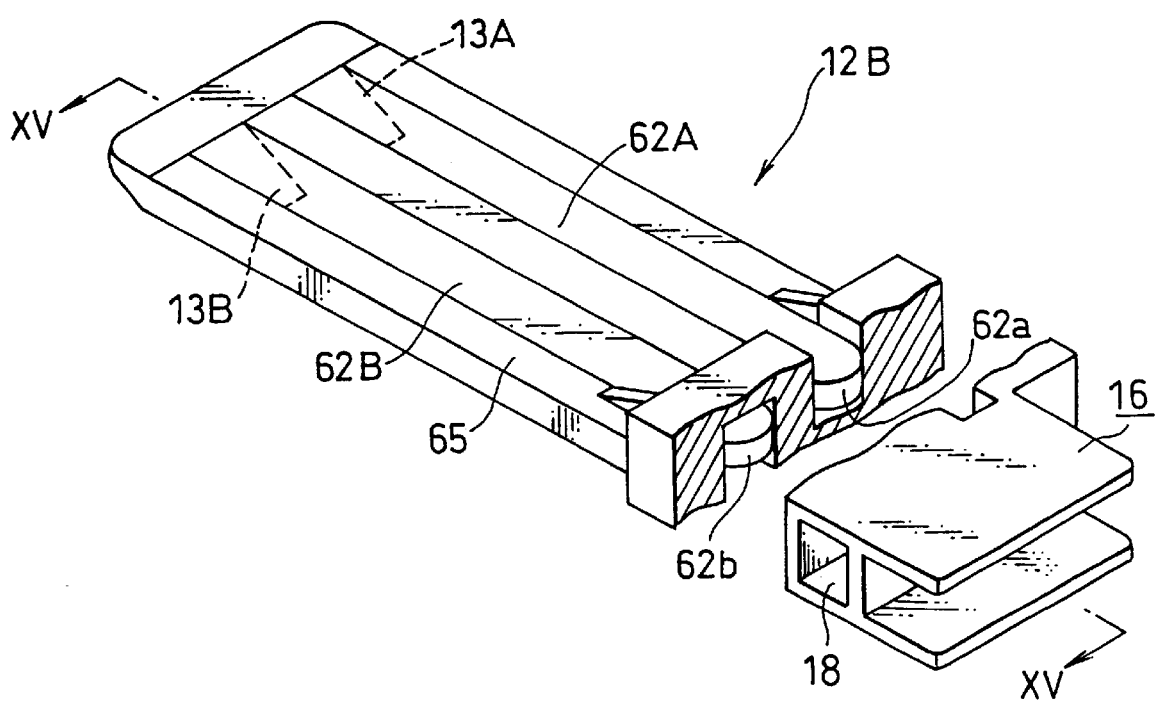
FIG. 14 is a perspective view of a sensing arm according to a second modification, a portion of which is cut off.
Figure 15:
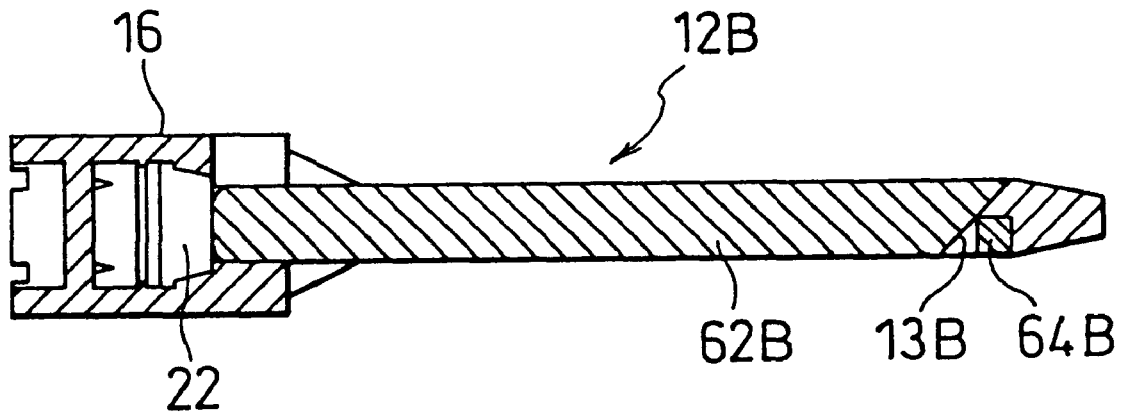
FIG. 15 is a sectional view of FIG. 14 taken along line XV—XV.

FIGS. 14 and 15 illustrate a second modification of the sensing arm.

Here a sensing arm 12B includes an arm frame 65 formed as an integral part of the mounting piece 16. The arm frame 65 has a shape obtained by adding one additional member to the central portion of the arm frame 15 of the first embodiment.

Optical guides 62A, 62B are provided between the outwardly extending members of the arm frame 65 and the central member thereof. The optical guides 62A, 62B have distal ends formed to include the oblique reflecting surfaces 13A, 13B. The reflecting surfaces 13A, 13B also are constructed by forming 45-degree oblique surfaces on the distal ends of the optical guides 62A, 62B and either affixing mirrors to these oblique surfaces or vapor-depositing aluminum or the like on these surfaces.

The end faces of the optical guides 62A, 62B on the side of the light-projecting and photoreceptor elements are formed into curved surfaces 62a, 62b so as to project outwardly. The curved surfaces 62a, 62b possess a lens function. Projected light from the light-projecting element is collimated by this lens functioning portion and impinges upon the optical guide 62A. Light that is guided by the optical guide 62B is condensed by its lens functioning portion and impinges upon the photoreceptor element.

The distal ends of the optical guides 62A, 62B on the sides in back of the reflecting surfaces 13A, 13B are provided with reflecting members (only one of which is indicated at 64B in FIG. 15). These reflecting members are formed to have the reflecting surfaces 14A, 14B (not shown). The reflecting surfaces 14A, 14B of the reflecting members are formed by affixing mirrors or by vapor-depositing aluminum, or they may be implemented by prisms.

The sensing arm of the second modification also possesses the advantage of high strength and, in comparison with the sensing arm of the first modification, is easy to fabricate because it need not be separated into a base and cover.

Figure 16:
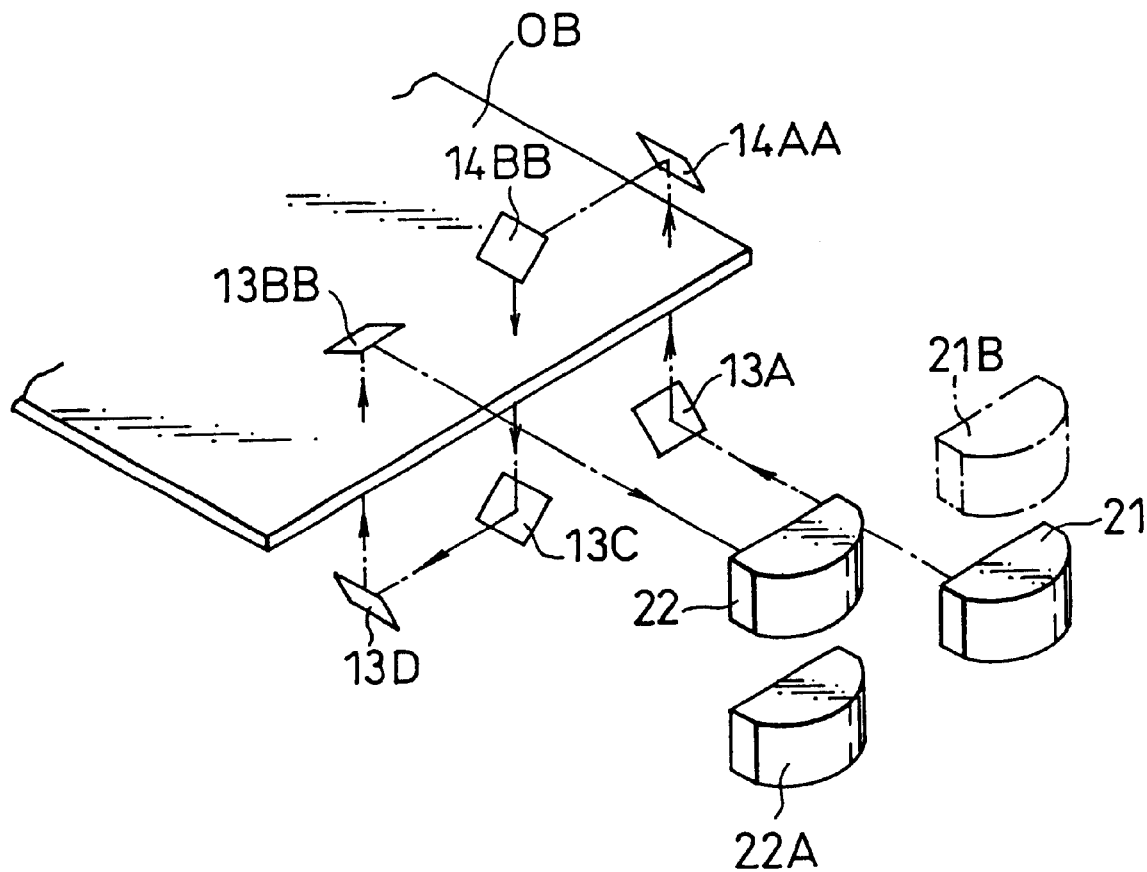
FIG. 16 illustrates another sensing principle.

FIG. 16 illustrates another sensing principle. Here projected light is passed through the object OB (the sensing area) three times. Projected light from the light-projecting element 21 of a preceding stage is received by the photoreceptor element 22 of a succeeding stage.

Light emitted by the light-projecting element 21 is reflected by the reflecting surface 13A, directed toward the object OB and passes through the object OB. This light is reflected by the reflecting surfaces 14AA, 14BB, is directed toward the object OB and passes through the object OB again. This light is further reflected by reflecting surfaces 13C, 13D, passes through the object OB a third time, is reflected by a reflecting surface 13BB and is directed toward the photoreceptor element 22.

Since the object OB is traversed three times, the light received by the photoreceptor element is attenuated greatly even if the object OB is transparent, thus making it possible to sense a transparent body much more accurately. If the transmittance of a transparent wafer is 92% and the amount of received light in the absence of the wafer is 100, the amount of received light when the transparent wafer is present will be 100×0.92×0.92×0.92=77.9. By setting a threshold value in the vicinity of, e.g., 86, a transparent wafer can be sensed. The S/N ratio of the amount of received light is larger in comparison with the first embodiment, thus making it possible to sense a transparent wafer more stably.

It will suffice to provide the sensing arm with the light-projecting element 21, a photoreceptor element 22A for receiving the light of a preceding stage, the reflecting surfaces 13A, 13C, 13D, and the reflecting surfaces 14A, 14B, 13B (which correspond to the reflecting surfaces 14AA, 14BB, 13BB) for light of the preceding stage.

Figure 17:
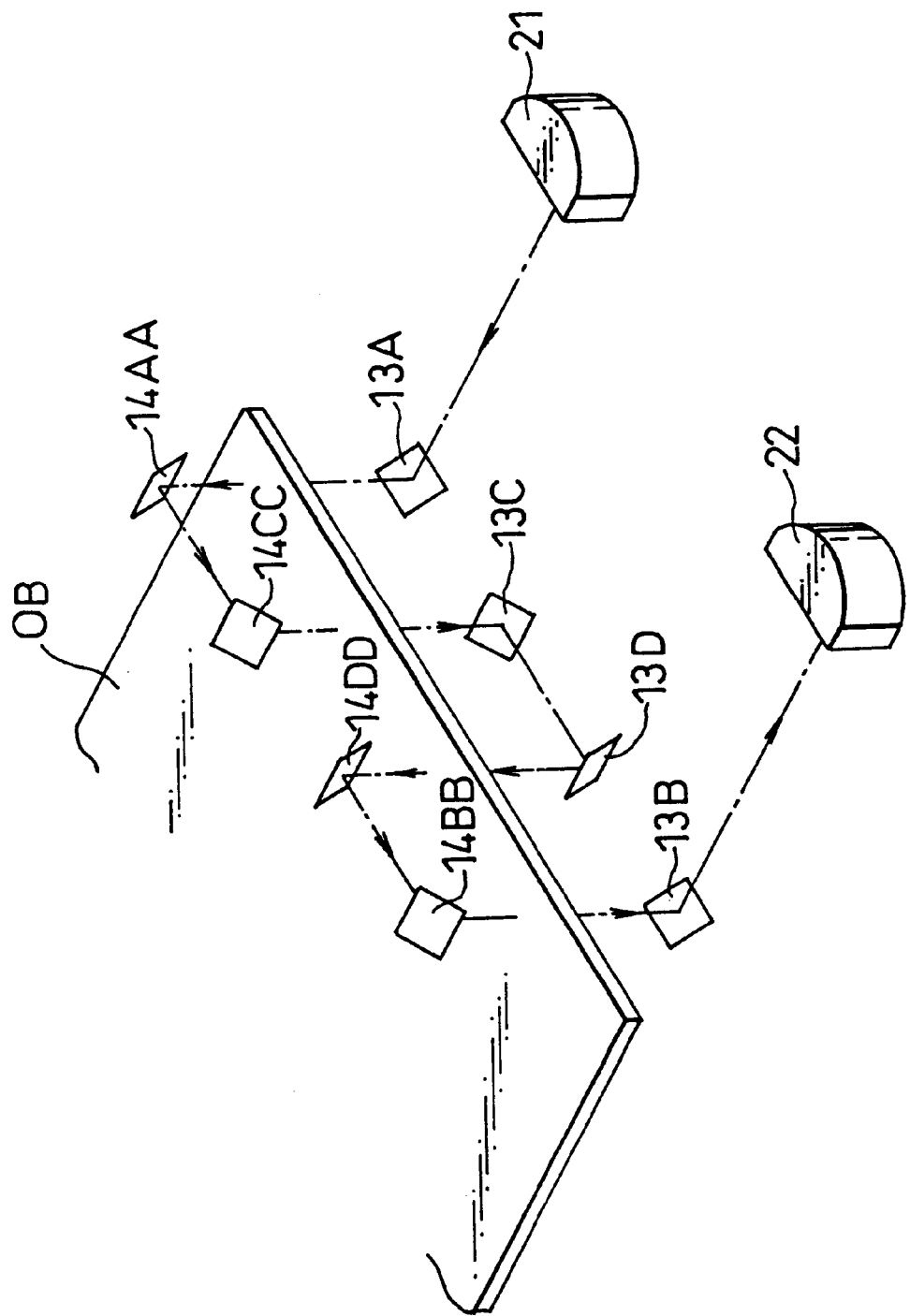
FIG. 17 illustrates yet another sensing principle.

FIG. 17 illustrates an arrangement in which projected light passes through the object OB (the sensing area) four times. In comparison with the first embodiment, the central reflecting surfaces 13C, 13D, 14CC, 14DD have been added.

Projected light from the light-projecting element 21 is reflected by the reflecting surface 13A to pass through the object OB once, is reflected by the reflecting surfaces 14AA, 14CC to pass through the object OB a second time, is reflected by the reflecting surfaces 13CC, 13D to pass through the object OB a third time, is reflected by the reflecting surfaces 14DD, 14BB to pass through the object OB a fourth time, and is finally reflected by the reflecting surface 13B to impinge upon the photoreceptor element 22.

If the transmittance of a transparent wafer is 92% and the amount of received light in the absence of the wafer is 100, the amount of received light will be 100×0.92×0.92×0.92×0.92=71.6. This provides a further improvement in S/N ratio. A transparent wafer can be sensed with even greater stability.

It will suffice to provide the sensing arm with the light-projecting element 21, the photoreceptor element 22, the reflecting surfaces 13A, 13C, 13D, 13B and the reflecting surfaces 14A, 14C, 14D, 14B (which correspond to the reflecting surfaces 14AA, 14CC, 14DD, 14BB) for the light of the preceding stage.

The number of times light is passed through a transparent wafer (sensing area) can be made five or more. The S/N ratio is improved even further and the sensing of transparent wafers is stabilized even further.

Second Embodiment

Figure 18:
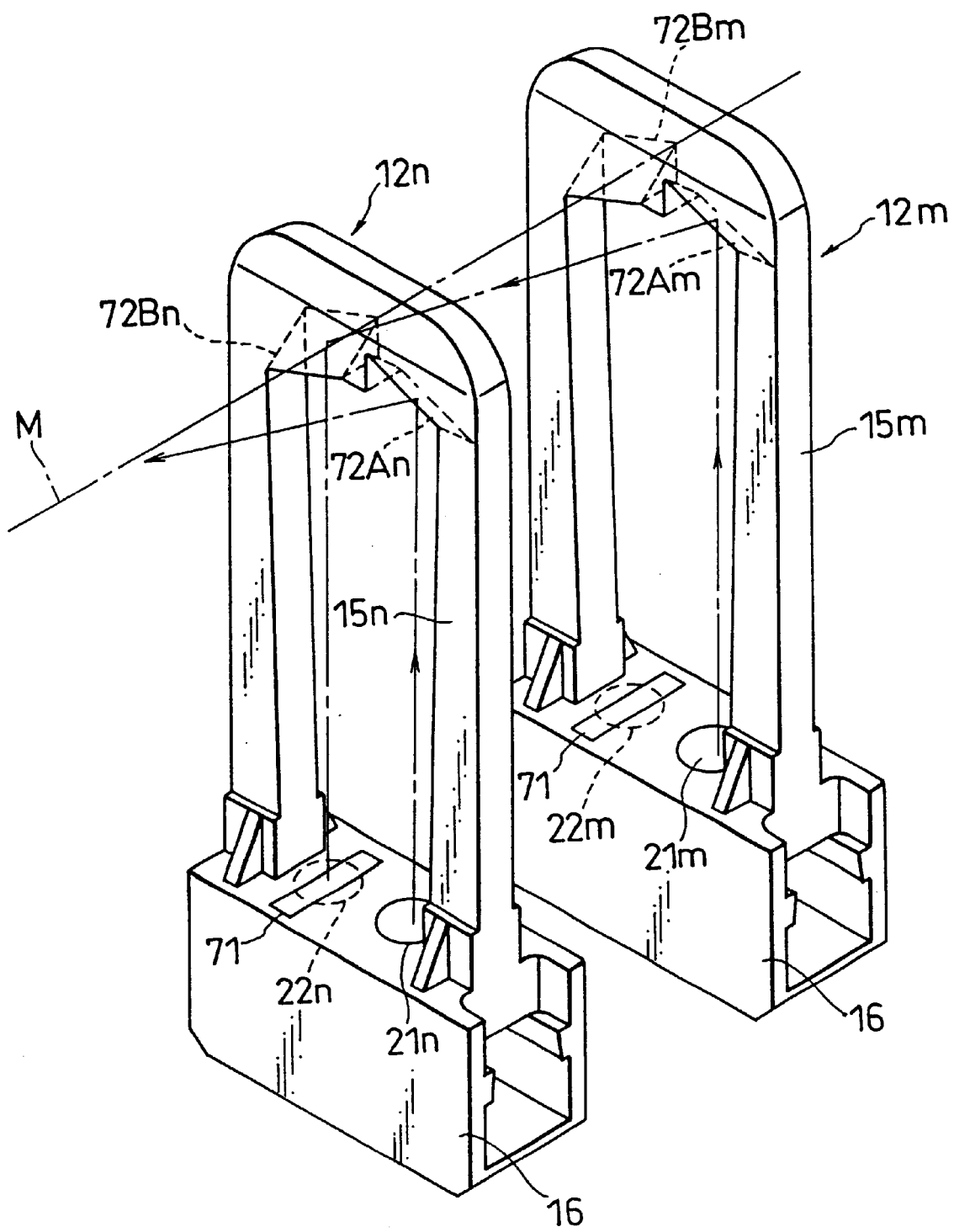
FIG. 18 is a perspective view showing several sensing arms illustrating a second embodiment.

FIG. 18 illustrates part of a wafer sensor according to a second embodiment. Two adjacent sensing arms are shown. Sensing arms the number of which is one greater than the number of wafers to be sensed at one stroke are arrayed in a case (not shown) unidirectionally in one row. The wafers serving as the objects to be sensed are flat, plate-shaped objects and are situated between sensing arms in such a manner that the direction in which the sensing arms are arrayed and the surfaces of the wafers will be perpendicular.

The two adjacent sensing arms are indicated by characters 12m and 12n. Because these sensing arms are identical, first one of the sensing arms, namely 12m, will be described.

The sensing arm 12m has an arm frame 15 formed as an integral part of the mounting piece 16. A light-projecting element 21m and a photoreceptor element 22m are accommodated within the mounting piece 16. The light-projecting and photoreceptor elements 21m, 22m are drawn as solid-line and dashed-line circles, respectively, in FIG. 18 for the sake of convenience.

The connecting member at the distal end of the arm frame 15m *of sensing arm 12m* has an inner side formed to include two reflecting surfaces 72Am, 72Bm as by affixing mirrors or vapor-depositing aluminum. The reflecting surface 72Am reflects projected light, which is emitted from the light-projecting element 21m and advances along one side of the frame 15m, approximately perpendicular to the direction in which the projected light advances and obliquely with respect to the direction (indicated by the dot-and-dash line M) in which the sensing arms are arrayed. The reflecting surface 72Bn reflects the light, which has advanced obliquely with respect to the array direction M, approximately perpendicularly downward so as to direct the light toward the photoreceptor element 22m. The photoreceptor surface of the photoreceptor element 22m is formed to have a slit 71 for limiting the light that impinges upon the photoreceptor element 22m.

Components of the sensing arm 12n that are identical with those of the sensing arm 12m are designated by like reference numerals with the character "n" replacing the character "m".

Light emitted from the light-projecting element 21m of the sensing arm 12m is reflected by the reflecting surface 72Am, directed toward the reflecting surface 72Bn of the neighboring sensing arm 12n, reflected by the reflecting surface 72Bn and received by the photoreceptor element 22n via the slit 71.

Figure 19A:
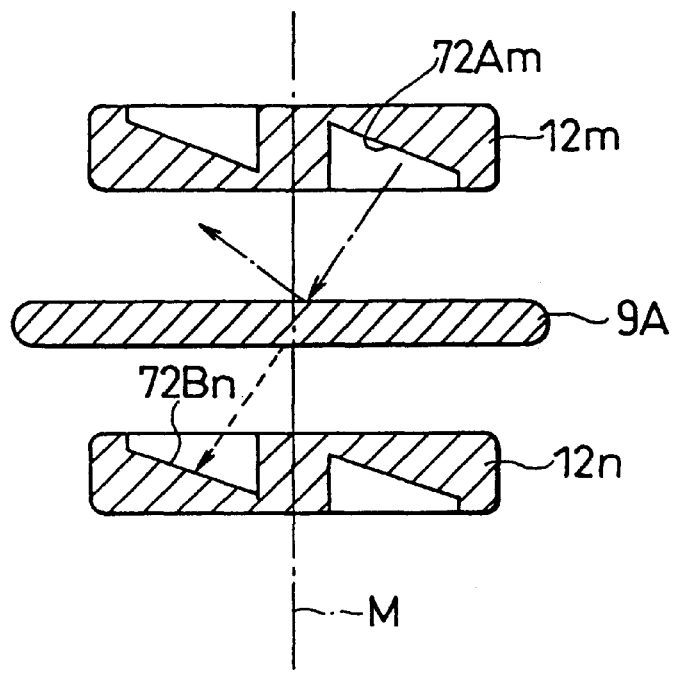
FIGS. 19a and 19b illustrate the sensing principle of a wafer sensor according to a second embodiment.
Figure 19B:
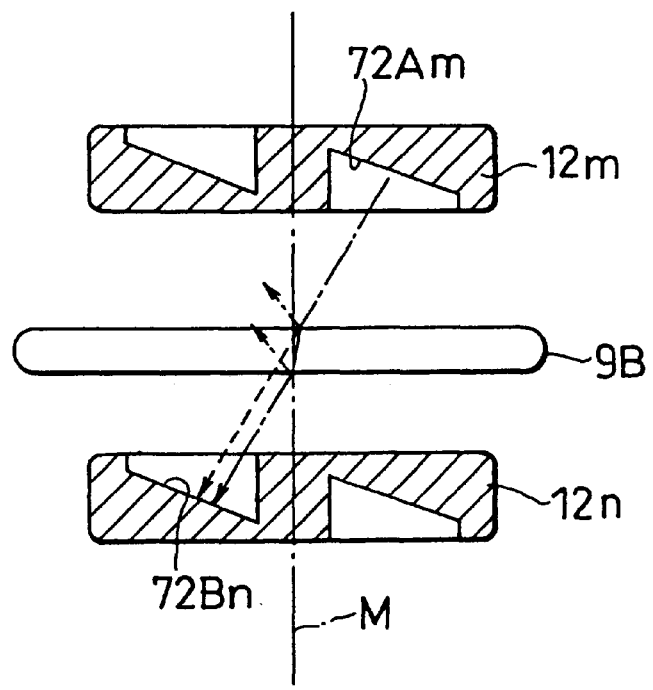

The sensing principle is illustrated in FIGS. 19a and 19b.

In a case where an opaque wafer 9A is present between the two sensing arms 12m and 12n in FIG. 19a, projected light from a reflecting surface 72Am is reflected by the surface of the wafer 9A and does not reach a reflecting surface 72Bn. Naturally, the light does not reach the photoreceptor element 22n either.

Assume that a transparent or semi-transparent wafer 9B is present between the two sensing arms 12m and 12n in FIG. 19b. The surface of the wafer 9B is perpendicular to the array direction M, and projected light from the reflecting surface 72Am impinges on the wafer 9B obliquely.

Light which impinges obliquely upon the transparent or semi-transparent wafer 9B and passes through the wafer 9B sustains loss in terms of the amount of light owing to reflection (loss due to surface reflection, which depends upon the angle of incidence, and loss of light due to Fresnel reflection internally of the wafer). Light that has passed through the wafer 9B is reflected by the reflecting surface 72Bn and is received by the photoreceptor element 22n.

The amount of light received by the photoreceptor element 22n is fairly small, in comparison with a case where light is received upon impinging on the wafer 9B perpendicularly and then passing through the wafer, owing to the above-mentioned loss in light quantity due to reflection of light incident obliquely, and further the amount of loss is very great as compared with a case where the wafer 9B is absent. Accordingly, a considerable difference develops in the amount of received light between a case where a wafer is absent and a transparent or semi-transparent wafer is present, and it is possible to distinguish between these cases by using the levels of the photoreception signals. It will suffice to set a threshold value between the amount of light received in the absence of a wafer and the amount of light received in the presence of a transparent or semi-transparent wafer.

When light passes through the transparent or semi-transparent wafer 9B obliquely, the optic axis is displaced, as indicated by the broken line and dot-and-dash line in FIG. 19b. As a result, the position at which light reflected by the reflecting surface 72Bn impinges upon the photoreceptor element 22n also is displaced. The slit 71 is formed at the position at which the center of the light rays impinges in the absence of a wafer. In the case where the wafer 9B is present, the center of the light rays incident upon the photoreceptor element 22n will be outside the slit 71 or, if inside the slit, on the edge thereof. The amount of light actually incident upon the photoreceptor element 22n, therefore, decreases considerably. Owing to provision of the slit 71, the amount of light received by the photoreceptor element in a case where a transparent or semi-transparent wafer is present decreases considerably in comparison with a case where no wafer is present, thus making it possible to distinguish between these cases accurately. It is preferred that the width and position of the slit 71 be decided, taking into consideration such factors as the beam diameter and incident position of the incident light, in such a manner that the amount of light incident upon the photoreceptor element 22n will decrease as much as possible if the wafer 9B is present.

It will suffice to drive the light-projecting elements and photoreceptor elements as follows in a case where a multiplicity of sensing arms are arrayed:

By opening the gate, which controls the passage of a photoreception signal from the nth photoreceptor element 22n (arrayed alongside the mth light-projecting element) (n=m+1), at the timing at which the mth light-projecting element 21m is driven to emit projected light (or shortly after this timing), the output signal of this photoreceptor element is accepted. The light-projecting element that is driven and the photoreceptor element whose gate is opened are staggered one at a time at a fixed period. That is, it will suffice to treat the light-projecting element of one of the neighboring sensing arms and the photoreceptor element of the other as one pair.

An arrangement may be adopted in which a light-projecting element is placed at the position of the reflecting surface 72Am, a photoreceptor element is placed at the position of the reflecting surface 72Bn, light from the light-projecting element is made to impinge obliquely upon a wafer (the object to be sensed) and light that has passed through the wafer obliquely is received by the photoreceptor element.

Since the optic axis of the light that has passed through the wafer (the object to be sensed) obliquely is displaced, as described above, the presence of a transparent or semi-transparent wafer can be sensed also by detecting this shift in the optic axis (the shift in the position of incidence). The presence of a transparent or semi-transparent wafer may be sensed based upon both a shift in the position of incidence and a decrease in amount of received light.

Figure 20:
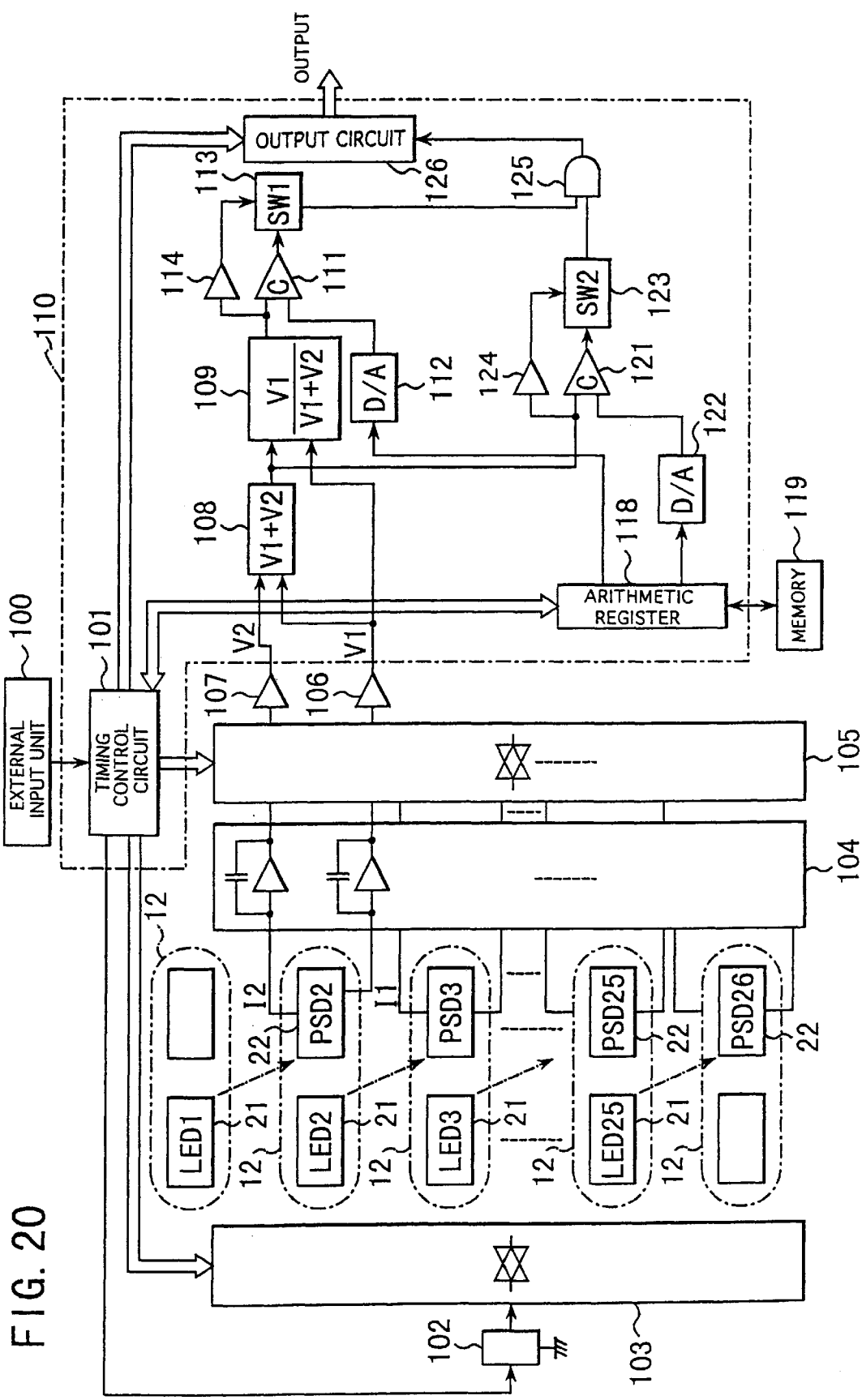
FIG. 20 is a block diagram showing an example of a sensing circuit according to the second embodiment.

In the cases described above, a position sensing device (PSD) may be employed instead of a photoreceptor element. FIG. 20 illustrates a circuit for sensing a transparent (or semi-transparent) wafer based upon position of incidence and amount of received light.

It is assumed that 26 sensing arms 12 (indicated collectively at reference numeral 12) have been arrayed. The first sensing arm is provided with only a light-emitting element 21 (indicated by LED1); no PSD is provided. A light-emitting element and PSD provided on the second sensing arm are denoted by LED2 and PSD2, respectively. Similarly, the light-emitting element and PSD of an ith (i=3–25) sensing arm are denoted by LEDi and PSDi, respectively. The 26th sensing arm is provided with only a PSD, which is denoted by PSD26. In a case where a wafer is not present between the ith (i=1–25) sensing arm and a jth (j=i+1) sensing arm, or in a case where a transparent (or semi-transparent) wafer is present between them, the projected light from the light-emitting element LEDi is received by PSDj (channel i).

A driver 102 is provided to drive the LEDs. The output of the driver 102 is applied to any one of the LEDs via a projected-light gate switching circuit 103. The PSDs are one-dimensional PSDs whose two outputs I1, I2 are amplified by respective ones of first stage amplifiers (25×2=50 amplifiers are designated by reference numeral 104) and then applied to a photoreception gate switching circuit 105. The photoreceptor gate switching circuit 105 allows the passage of an output from any one PSD.

The projected-light gate switching circuit 103 and photoreception gate switching circuit 105 are controlled by a timing control circuit 101. The timing control circuit 101 controls the projected-light gate switching circuit 103 in such a manner that the LEDs 1–25 are driven sequentially at regular time intervals channel by channel. The timing control circuit 101 further controls the photoreception gate switching circuit 105 in such a manner that the output of the PSDj is allowed to pass at the moment the LEDi is driven (at a timing somewhat later than this, strictly speaking). The timing control circuit 101 is provided with the above-mentioned regular time intervals and other set inputs from an external input circuit 100.

The two outputs I1, I2 of the photoreception gate switching circuit 105 are amplified by amplifiers 106, 107 and converted to voltage signals V1, V2, respectively. The voltage signals V1, V2 are added by an adding circuit 108. Further, V1/(V1+V2) is calculated by a dividing circuit 109. The output of the dividing circuit 109 represents the position of incident light on the PSD.

A threshold value for position and a threshold value for amount of light have been set in a memory 119 as digital data. This digital data is set for each of the 25 PSDs (i.e., channel by channel). As a result, optimum threshold values commensurate with variance in the characteristics of the PSDs are assured. When the LED of a corresponding channel is driven, the threshold value of this PSD is read out of the memory 119 and applied to an arithmetic register 118. The threshold value for position is converted to an analog voltage signal by a D/A converter 112 and then applied to a comparator 111 as a reference voltage. The threshold value for amount of light is converted to an analog voltage signal by a D/A converter 122 and then applied to a comparator 121 as a reference voltage.

In the absence of a wafer between two adjacent sensing arms, the sensed-position output of the PSD of the sensing arm (the output of the dividing circuit 109) will take on a value corresponding to the midpoint. In a case where a transparent or semi-transparent wafer is present, the sensed-position output of the PSD will be higher or lower than the midpoint value. Assume here that the output will be lower than the midpoint value. It is assumed that the threshold value for position has been set between the level of the sensed-position output of the PSD in the absence of a wafer and the level of the sensed-position output of the PSD in the presence of a transparent or semi-transparent wafer. The output of the dividing circuit 109 is applied to a comparator 111. The latter generates an output having the L level in the absence of a wafer and an output having the H level in the presence of a transparent or semi-transparent wafer.

The output of the dividing circuit 109 is applied also to a binarizing circuit 114. The latter generates an H-level signal in a case where the sensed-position output of the PSD possesses a certain level other than that of a burn-out state (a state in which light does not impinge upon the PSD owing to the presence of an opaque wafer, as a result of which the sensed-position output of the PSD takes on a very small value). The H-level signal is applied to a switching circuit 113. When the output of the comparator 111 is at the H level, the switching circuit 113 turns on and its output also attains the H level. When the output of the comparator 111 is at the L level, the output of the switching circuit 113 is held at the L level.

In the absence of a wafer between two adjacent sensing arms, the output, which represents the amount of received light, of the PSD of the sensing arm (the output of the adding circuit 108) takes on the maximum value. If a transparent or semi-transparent wafer is present, the PSD output representing the amount of received light falls below the maximum value. It is assumed that the threshold value for amount of light has been set between the level of the PSD output representing the amount of received light in the absence of a wafer and the level of the PSD output representing the amount of received light in the presence of a transparent or semi-transparent wafer. The output of the adding circuit 108 is applied to a comparator 121. The latter generates an output having the L level in the absence of a wafer and an output having the H level in the presence of a transparent or semi-transparent wafer.

The output of the adding circuit 108 is applied also to a binarizing circuit 124. The latter generates an H-level signal in a case where the PSD output representing the amount of received light possesses a certain level other than almost zero (a state in which light does not impinge upon the PSD owing to the presence of an opaque wafer, as a result of which the sensed-position output of the PSD takes on a very small value). The H-level signal is applied to a switching circuit 123. When the output of the comparator 121 is at the H level, the switching circuit 123 turns on and its output also attains the H level. When the output of the comparator 121 is at the L level, the output of the switching circuit 123 is held at the L level.

When a transparent (or semi-transparent) wafer is present, the outputs of the switching circuits 113, 123 both are at the H level. The AND of these H-level signals is taken by an AND gate 125, and the result of the AND operation is output via an output circuit 126.

By thus taking the AND between the sensed-position output and the output representing the amount of received light, the reliability with which the presence of a transparent (or semi-transparent) wafer is sensed is improved.

It goes without saying that the function of the circuitry enclosed by the dot-and-dash line 110 can be implemented not only by hardware but also by a programmed CPU or the like.

An arrangement may be adopted in which the binarizing circuits 114, 124 and the switching circuits 113, 123 are eliminated and the outputs of the comparators 111, 121 are applied to the AND gate 125 directly.

By setting two different threshold values with respect to the sensed-position output of the PSD, it is possible to discriminate (a) absence of a wafer, (b) a transparent (or semi-transparent) wafer, and (c) an opaque wafer. By setting two different threshold values with respect to the PSD output representing the amount of received light, it is possible to discriminate (d) absence of a wafer, (e) a transparent wafer, and (f) a semi-transparent (or opaque) wafer. Absence of a wafer is determined by taking the AND between (a) and (d), presence of a transparent wafer is determined by taking the AND between (b) and (e), presence of a semi-transparent wafer is determined by taking the AND between (b) and (f), and presence of an opaque wafer is determined by taking the AND between (c) and (f). Thus, various states can be sensed with high reliability. Three different threshold values may be set with respect to the PSD output representing the amount of received light, the presence of an opaque wafer may be discriminated and this may be utilized to determine the presence of an opaque wafer.

Third Embodiment

A third embodiment relates to a wafer sensor in which the number of light-projecting elements and photoreceptor elements is reduced to half that of the first and second embodiments. The third embodiment has two modes depending upon the direction of the projected light.

The first mode will be described with reference to FIGS. 21 to 24.

Figure 21:
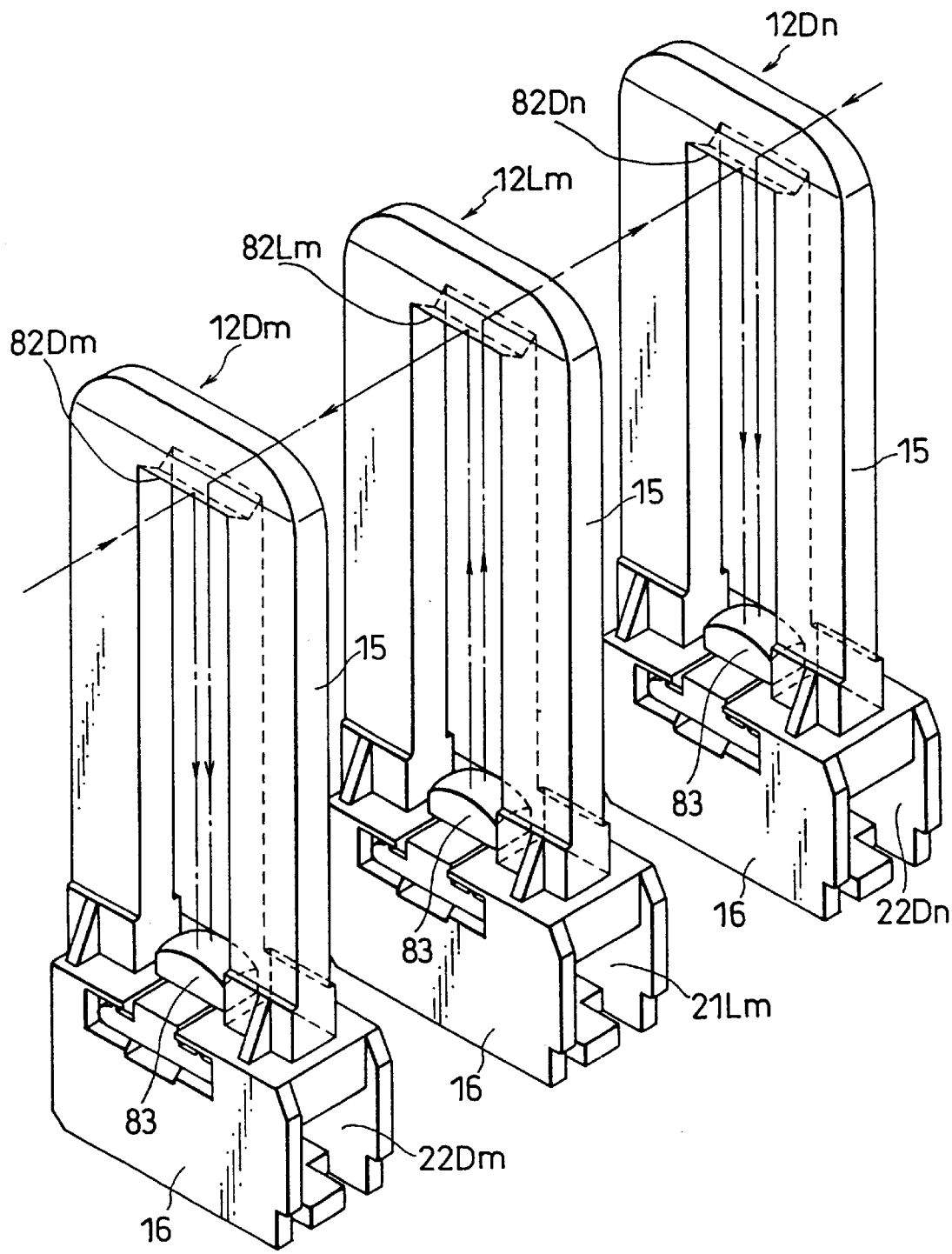
FIG. 21 is a perspective view of sensing arms illustrating a first mode in a third embodiment.
Figure 22:
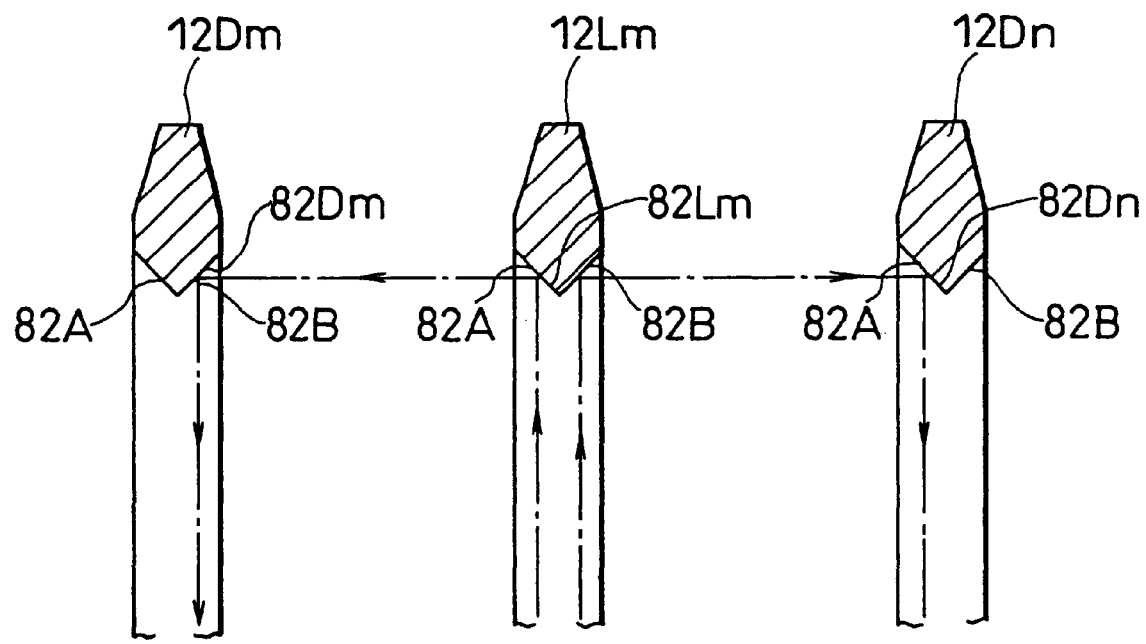
FIG. 22 is a longitudinal sectional view of part of each of the sensing arms shown in FIG. 21.

In particular, as shown in FIGS. 21 and 22, a multiplicity of sensing arms 12D*m*, 12L*m*, 12D*n*, etc., are arrayed in a single row. The connecting members at the distal ends of the arm frames 15 of these sensing arms have inner sides formed to include reflecting surfaces 82D*m*, 821*m*, 82D*n*, respectively, each comprising two oblique surfaces 82A, 82B having an angle of 45° with respect to the longitudinal direction of the arm. The two oblique surfaces 82A, 82B of these reflecting surfaces are also reflecting surfaces and are formed as by affixing mirrors or vapor-depositing aluminum.

A light-projecting element 21L*m* (only the reference character and not the element is shown) is accommodated within the mounting piece 16 of the sensing arm 82L*m*, and the projected light thereof is directed toward the reflecting surface 82L*m* via a lens 83. Photoreceptor elements 22D*m*, 22D*n* (only the reference characters and not the elements are shown) are accommodated within the mounting pieces 16 of the sensing arms 82D*m*, 82D*n* neighboring on both sides of the sensing arm 82L*m*. Light projected from the light-projecting element 21L*m* is split into two portions by the reflecting surface 82L*m*, and these portions are directed toward respective ones of the reflecting surfaces 82D*m* (82B), 82D*n* (82A) of the sensing arms 12D*m*, 12D*n*, respectively, neighboring on both sides, reflected by these reflecting surfaces and received by the corresponding photoreceptor elements 22D*m*, 22D*n*.

Figure 23:
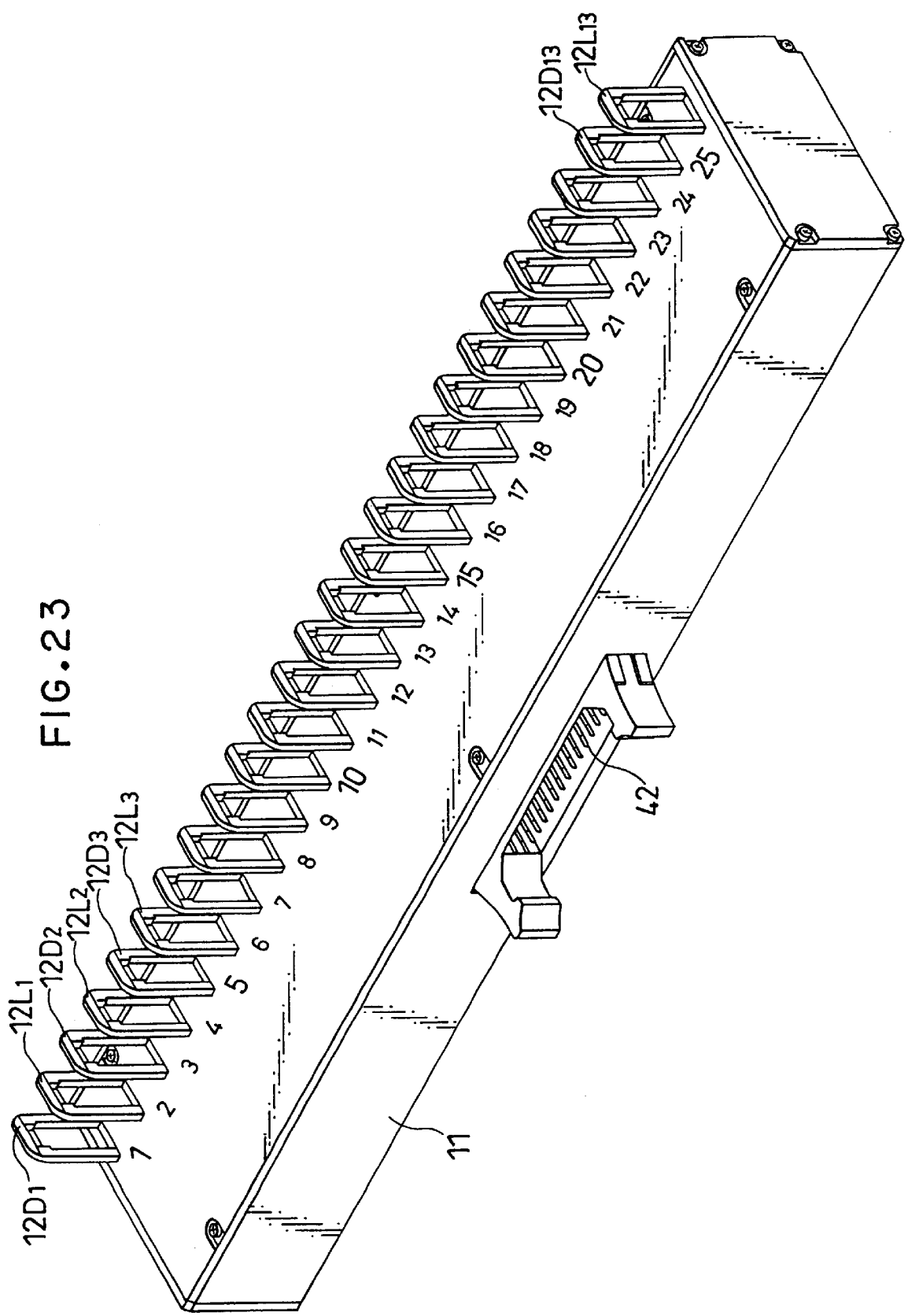
FIG. 23 is a perspective view of the overall wafer sensor.

In order to form sensing areas of 25 channels, the case 11 is provided with 26 of the sensing arms as shown in FIG. 23. Among these sensing arms, those indicated by reference characters 12L1, 12L2, . . . , 12L13 incorporate light-projecting elements and those indicated by reference characters 12D1, 12D2, . . , 12D13 incorporate photoreceptor elements. Thus, the sensing arms which include the light-projecting elements and the sensing arms which include the photoreceptor elements are arranged alternatingly. Since one sensing arm is provided with only a light-projecting element or a photoreceptor element, the number of light-projecting and photoreceptor elements can be reduced. The case 11 is provided with a connector 42.

The sensing areas of the respective channels are sensed sequentially at regular time intervals. Driving of the light-projecting elements and gating control of the photoreception signals of the photoreceptor elements will be described later.

Figure 24:
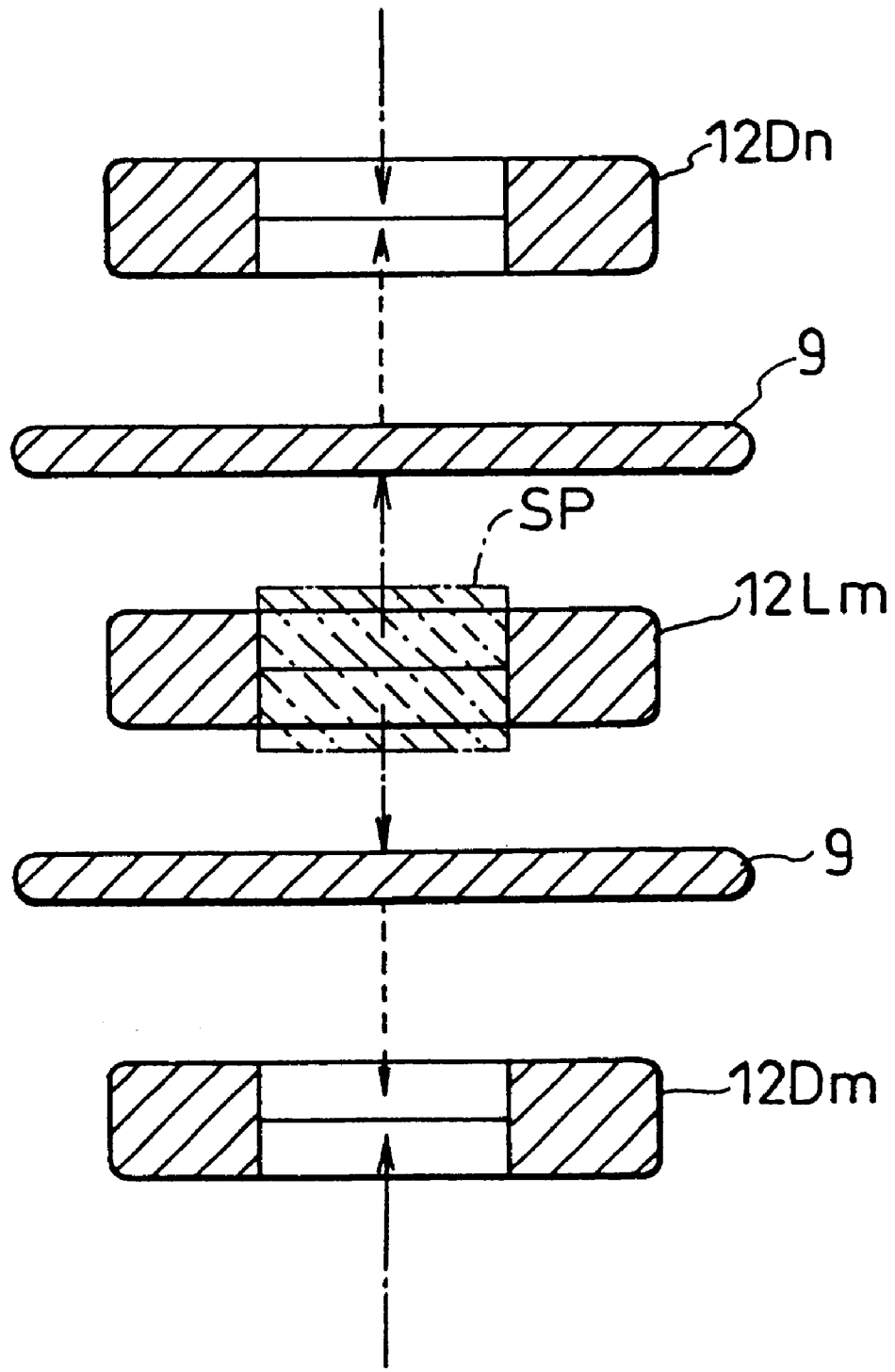
FIG. 24 illustrates the sensing principle of the first mode.

With reference to FIG. 24, projected light (SP indicates the projected beam from the light-projecting element) from the reflecting surface 82L*m* of the sensing arm 12L*m* incorporating the light-projecting element advances in the direction in which the sensing arms are arrayed. If the opaque wafer 9 is present between the two sensing arms 12L*m* and 12D*m* (or 12L*m* and 12D*n*), the projected light will be blocked and will not be received by the photoreceptor element of the neighboring sensing arm 12D*m* or 12D*n*. Thus it is possible to sense an opaque wafer. If a threshold value is chosen wisely, a transparent (or semi-transparent) wafer can be sensed as well.

Figure 25:
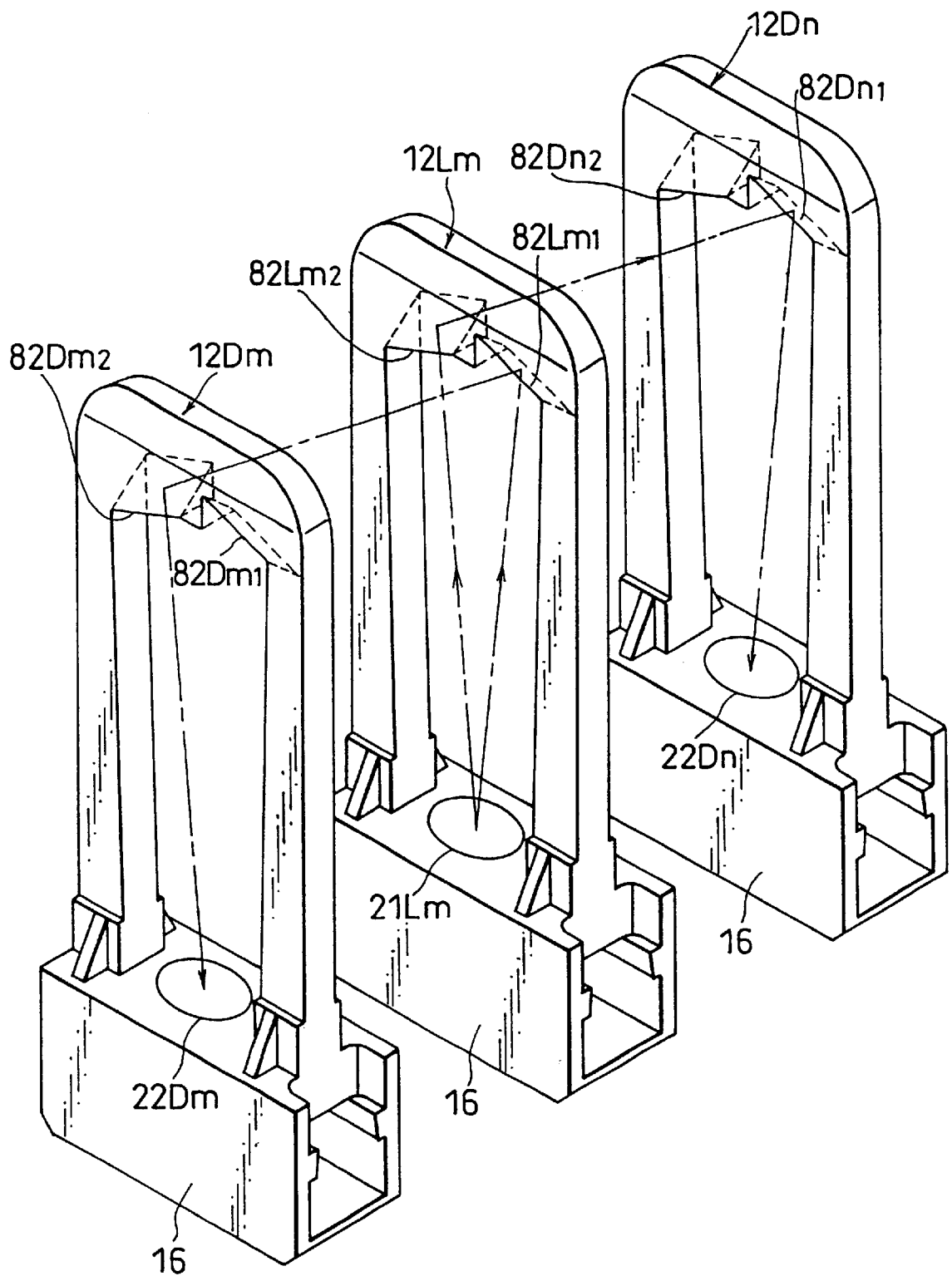
FIG. 25 is a perspective view of sensing arms illustrating a second mode in the third embodiment.

The second mode will now be described with reference to FIGS. 25 and 26. This mode is identical with the first mode in that the sensing arm 12L*m* incorporates the light-projecting element 21L*m*, the sensing arms 12D*m*, 12D*n* incorporate the photoreceptor elements 22D*m*, 22D*n*, and the sensing arms are arrayed in the case 11 in a single row, as illustrated in FIG. 23. This mode differs from the first mode in that the arrangement is such that projected light advances through the sensing areas obliquely with respect to the direction in which the sensing arms are arrayed, in a manner the same as that of the second embodiment shown in FIG. 18.

The sensing arm 12L*m* is formed to have reflecting surfaces 82L*m*1, 82L*m*2 for splitting the projected light from the light-projecting element 12L*m* into two portions and reflecting these obliquely in opposite directions, and the sensing arm 12D*m* (or 12D*n*) is formed to have reflecting surfaces 82D*m*1, 82D*m*2 (or 82D*n*1, 82D*n*2) for guiding light, which has advanced obliquely, to the photoreceptor element 22D*m* (or 22D*n*).

Figure 26:
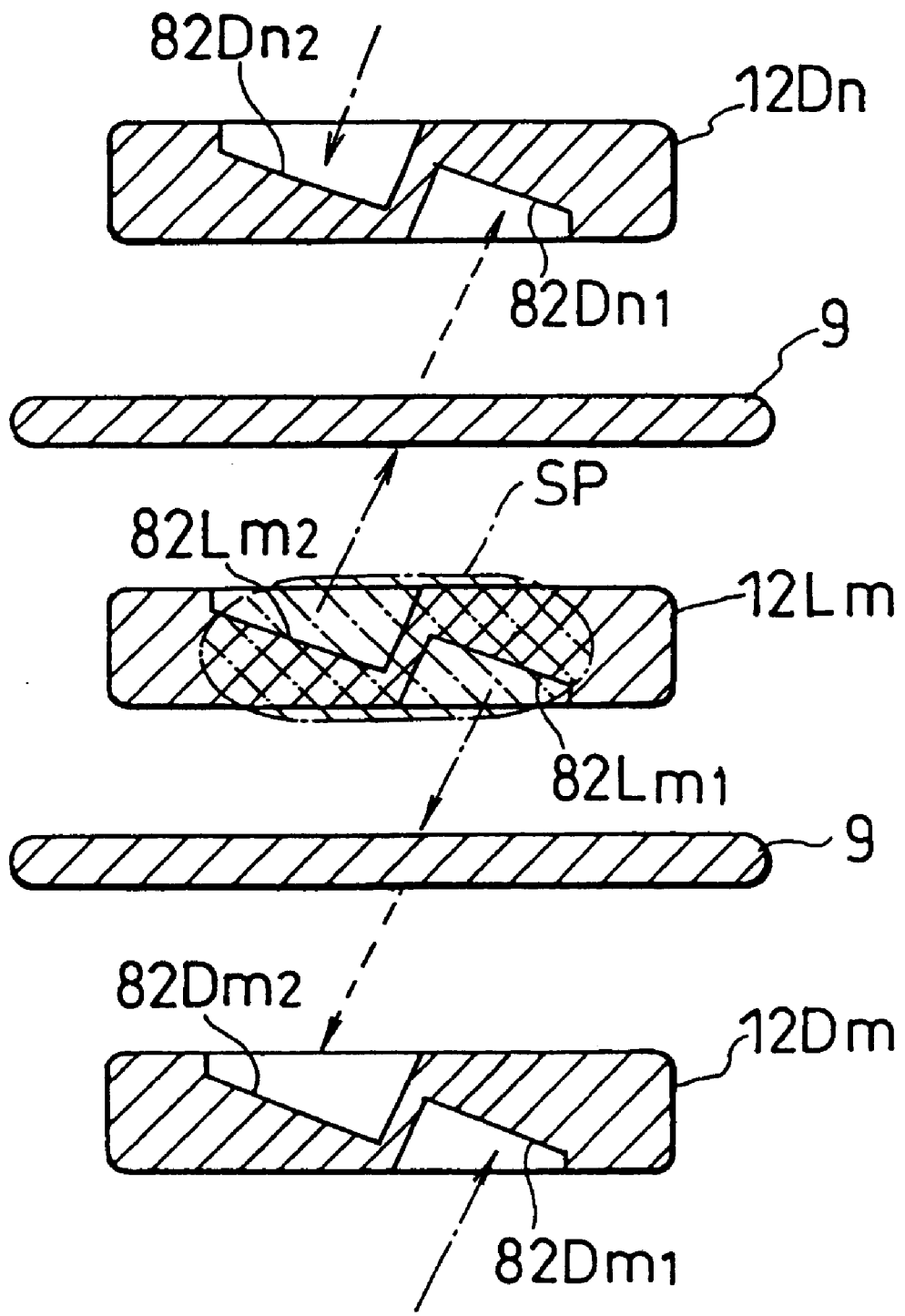
FIG. 26 illustrates the sensing principle of the second mode.

As shown in FIG. 26, projected light impinges obliquely upon the surface of the wafer 9, as described in conjunction with the second embodiment. Loss in terms of the amount of light increases and it is possible to sense not only an opaque wafer but also a transparent or semi-transparent wafer.

Figure 27:
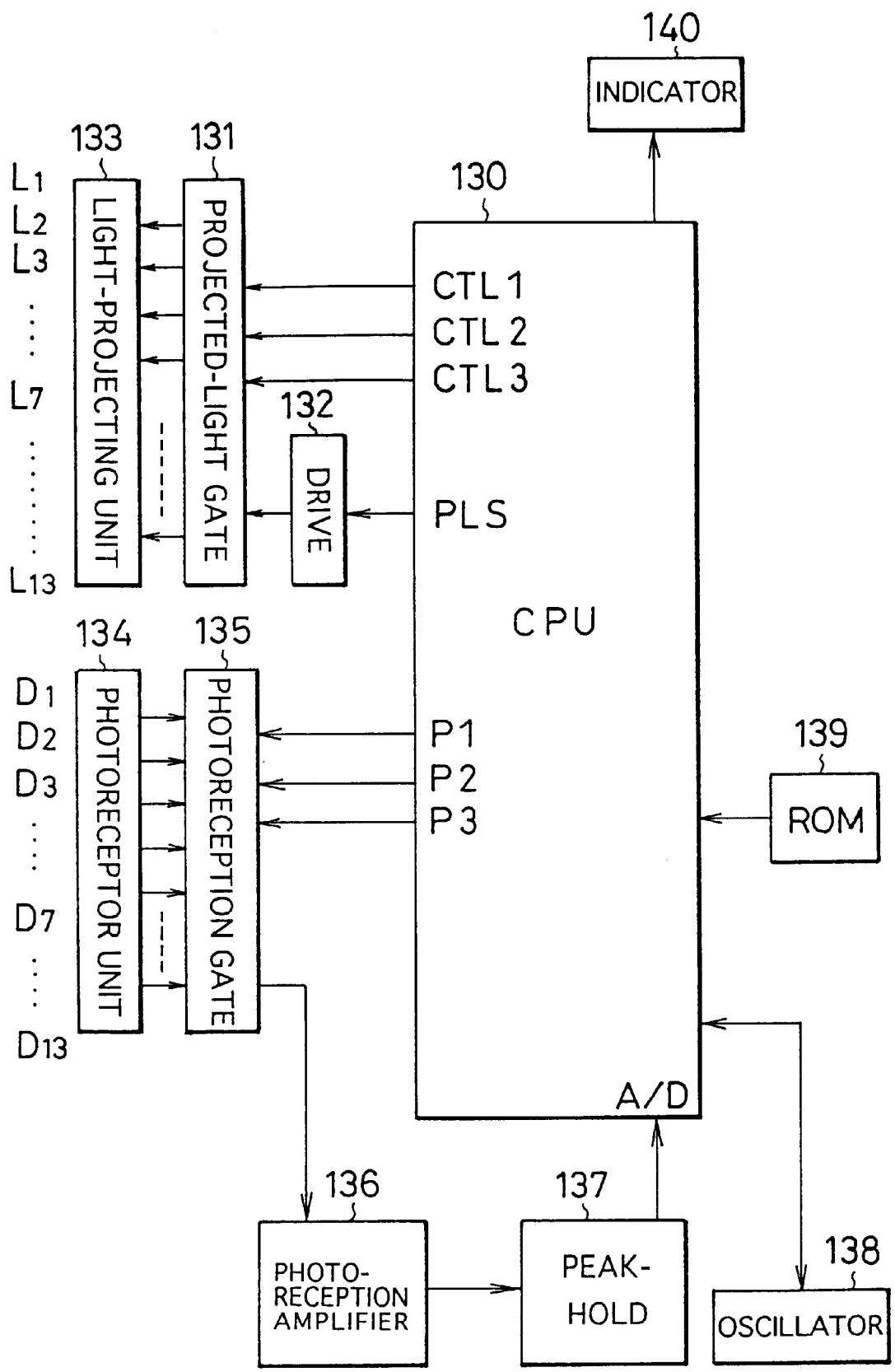
FIG. 27 is a block diagram showing an example of a sensing circuit according to the third embodiment.

FIG. 27 illustrates an example of a sensing circuit applied to wafer sensors of both the first and second modes described above.

This sensing circuit includes a CPU 130. The CPU 130 is accompanied by a ROM 139 and other memories, and an oscillating circuit 138 for applying a clock signal to the CPU 130 is connected to the CPU. An input circuit and an output circuit (neither of which are shown) are connected to the CPU 130.

In order to sense 25 channels (25 ch), 26 sensing arms are provided. As mentioned above, each sensing arm is provided with either a light-projecting element or a photoreceptor element. These light-projecting elements are represented by L1, L2, L3, . . . , L13, and the photoreceptor elements are represented by D1, D2, D3, . . . , D13. The light-projecting elements and photoreceptor elements are arrayed in the following order: L1, D1, L2, D2, L3, D3, . . . , L13, D13.

A driving circuit 132 generates drive pulses for light-projecting elements in response to a light-emission timing pulse PLS provided by the CPU 130. A projected-light gate 131 decodes light-projection control signals CTL1–CTL3 provided by the CPU 130 to open any one gate of 13 light-projecting elements L1–L13 of a light-projecting unit 133 and apply the drive pulse to one light-projecting element only.

A photoreceptor unit 134 includes 13 photoreceptor elements D1–D13. The photoreception signals of these photoreceptor elements are applied to a photoreceptor gate 135. The photoreceptor gate 135 decodes photoreception control signals P1–P3 provided by the CPU 130 to open a gate in such a manner that any one photoreception signal only will be applied to a photoreception amplifier 136.

The output of the photoreception amplifier 136 is held by a peak-hold circuit 137. While thus being held, the photoreception signal is accepted at an A/D port of the CPU 130. The peak-hold circuit 137 is reset at the timing at which the light-projecting elements start to be driven.

Indicator lamps 140 display the result of object detection for each channel of the 25 channels.

Figure 28:
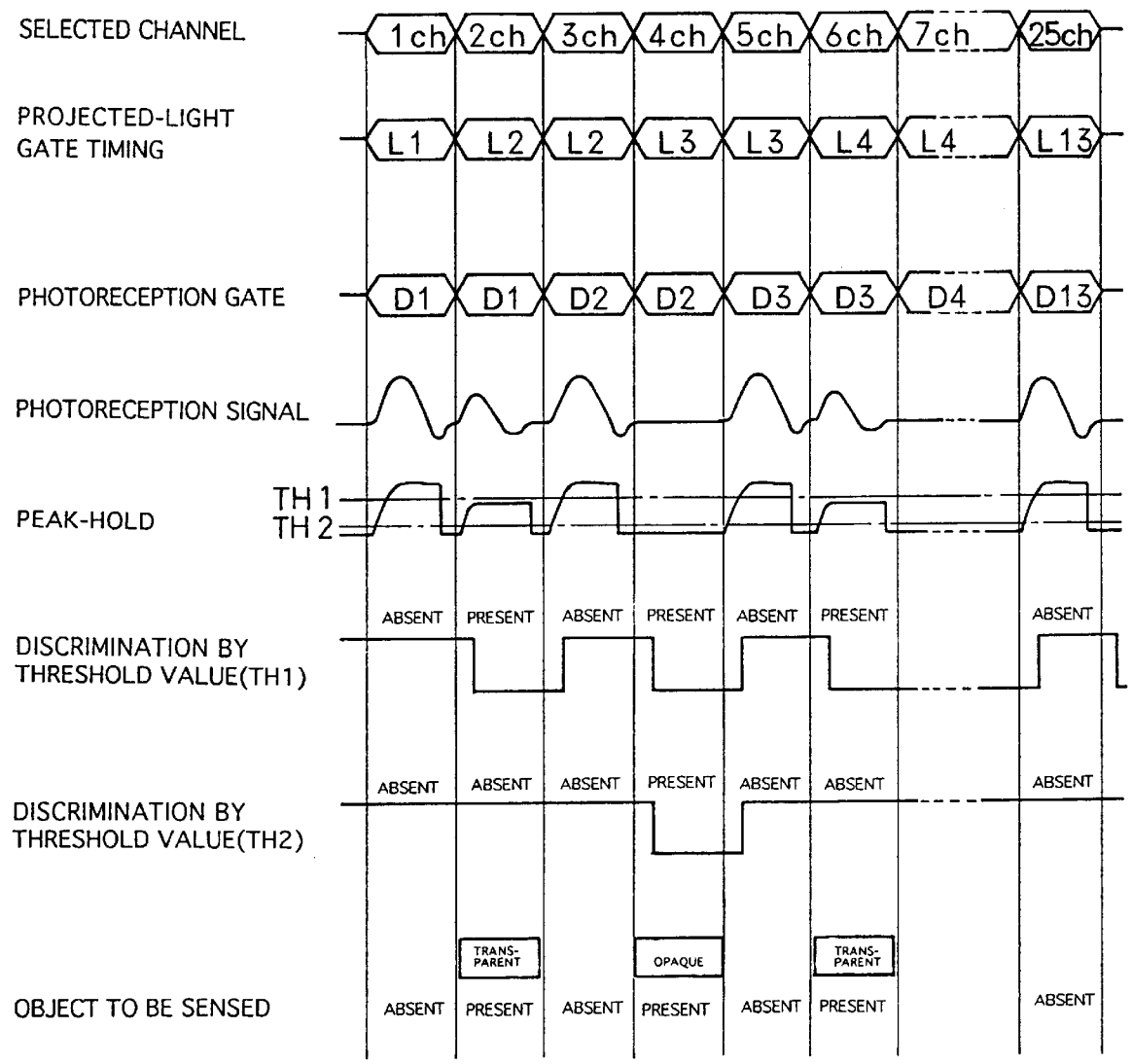
FIG. 28 is a time chart illustrating the operation of a sensing circuit according to the third embodiment.
Figure 29:
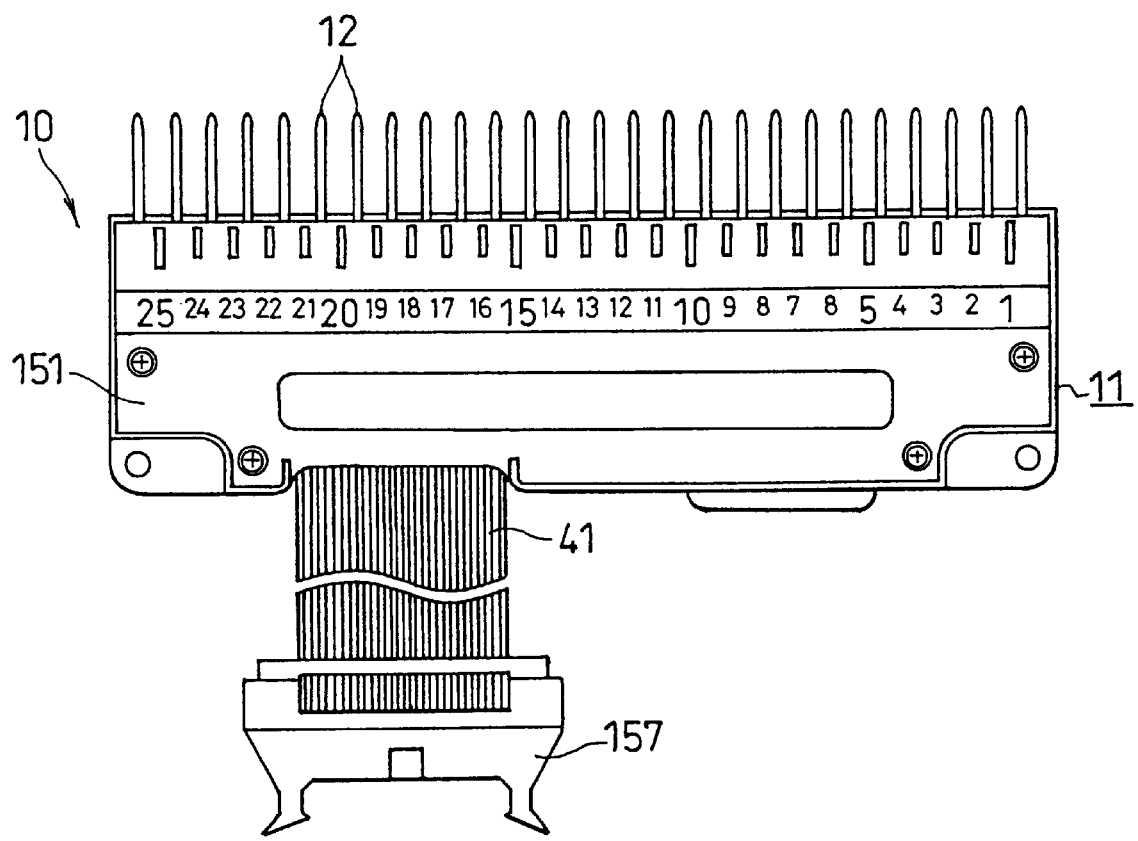
FIG. 29 is a front view of a wafer sensor illustrating a fourth embodiment.
Figure 30:
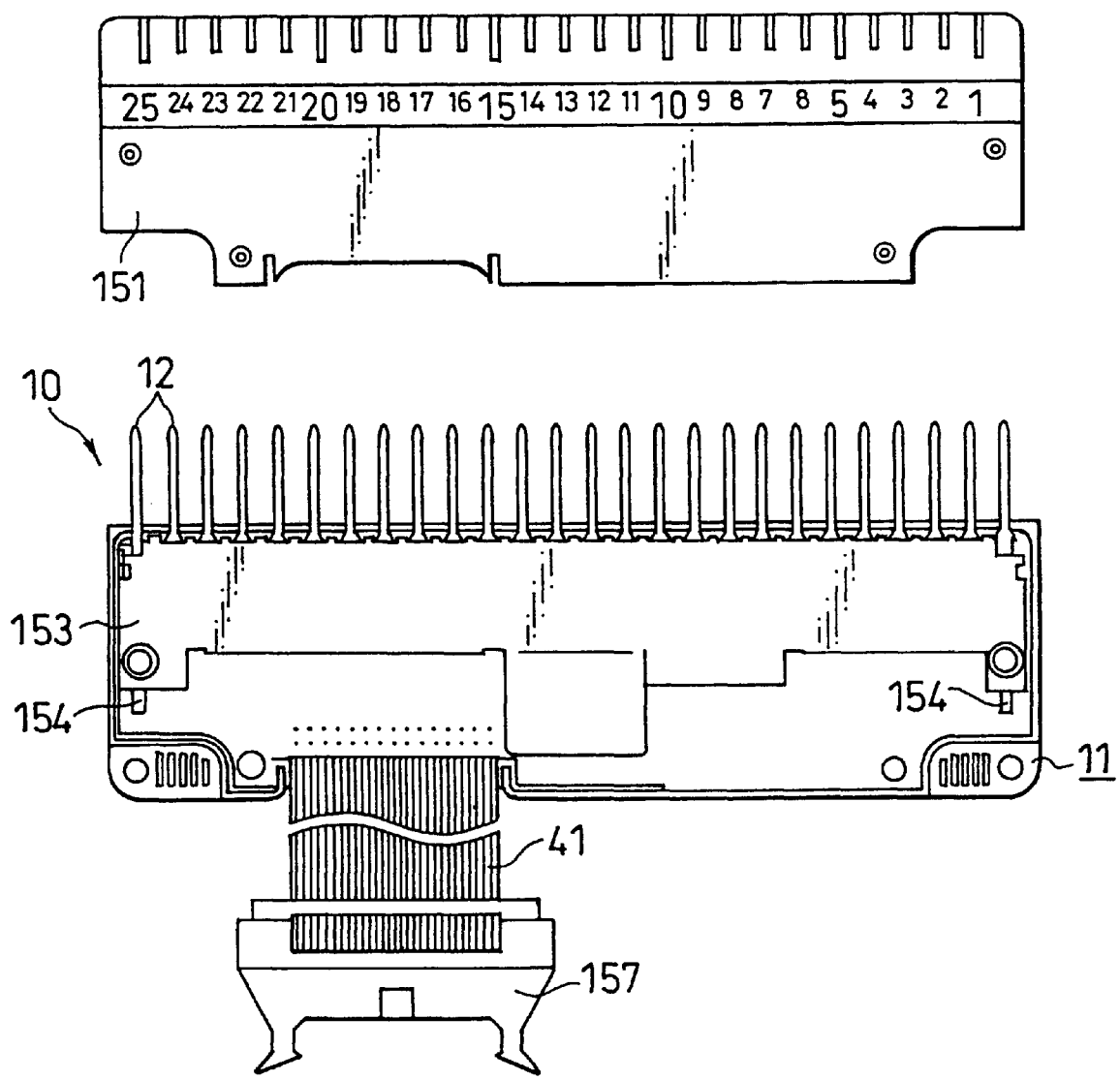
FIG. 30 is a front view in which the interior of the wafer sensor is exposed by removing a cover.
Figure 31:
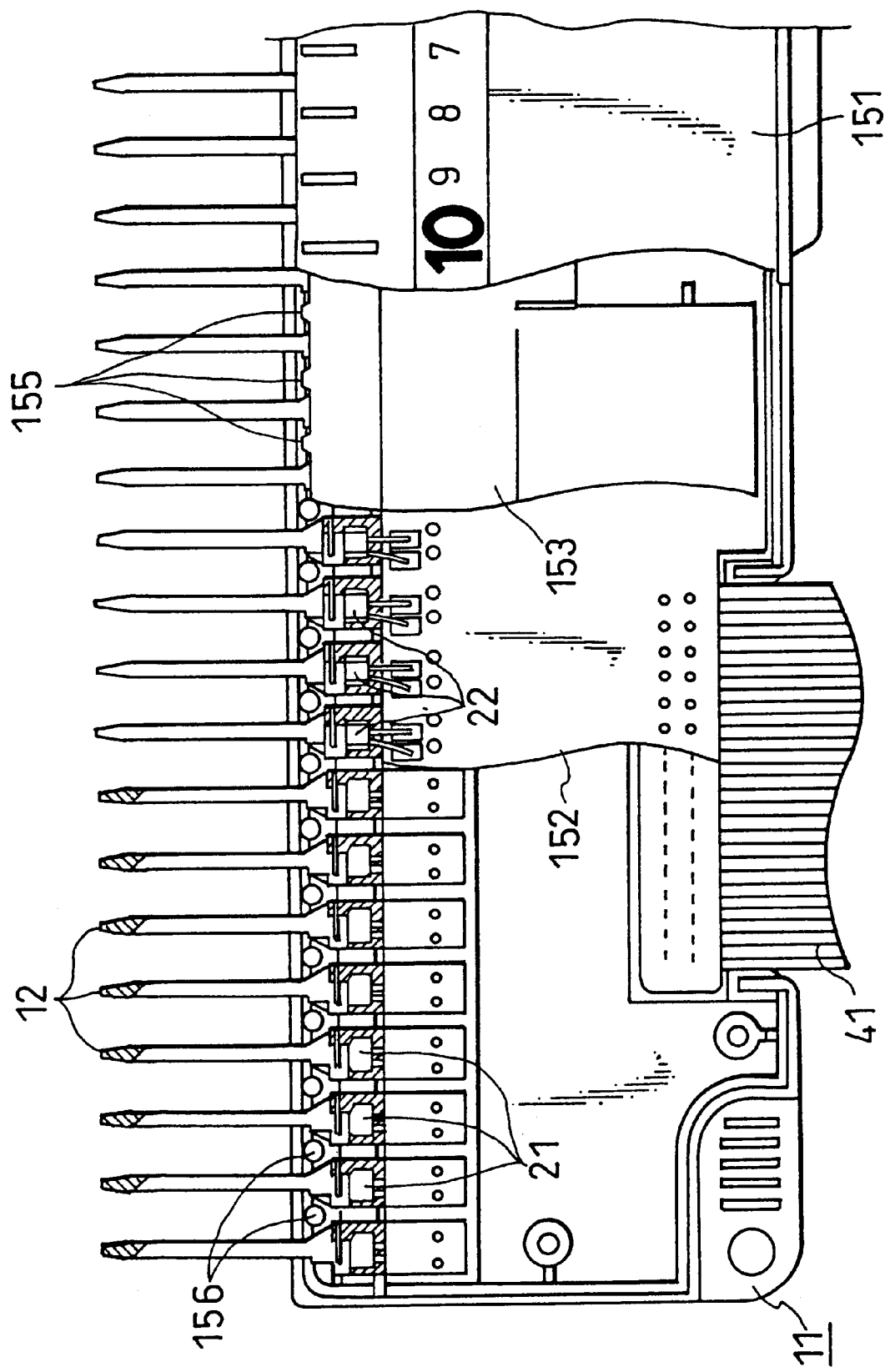
FIG. 31 is an enlarged sectional view in which the interior of the wafer sensor is shown by repeatedly breaking it away.
Figure 32:
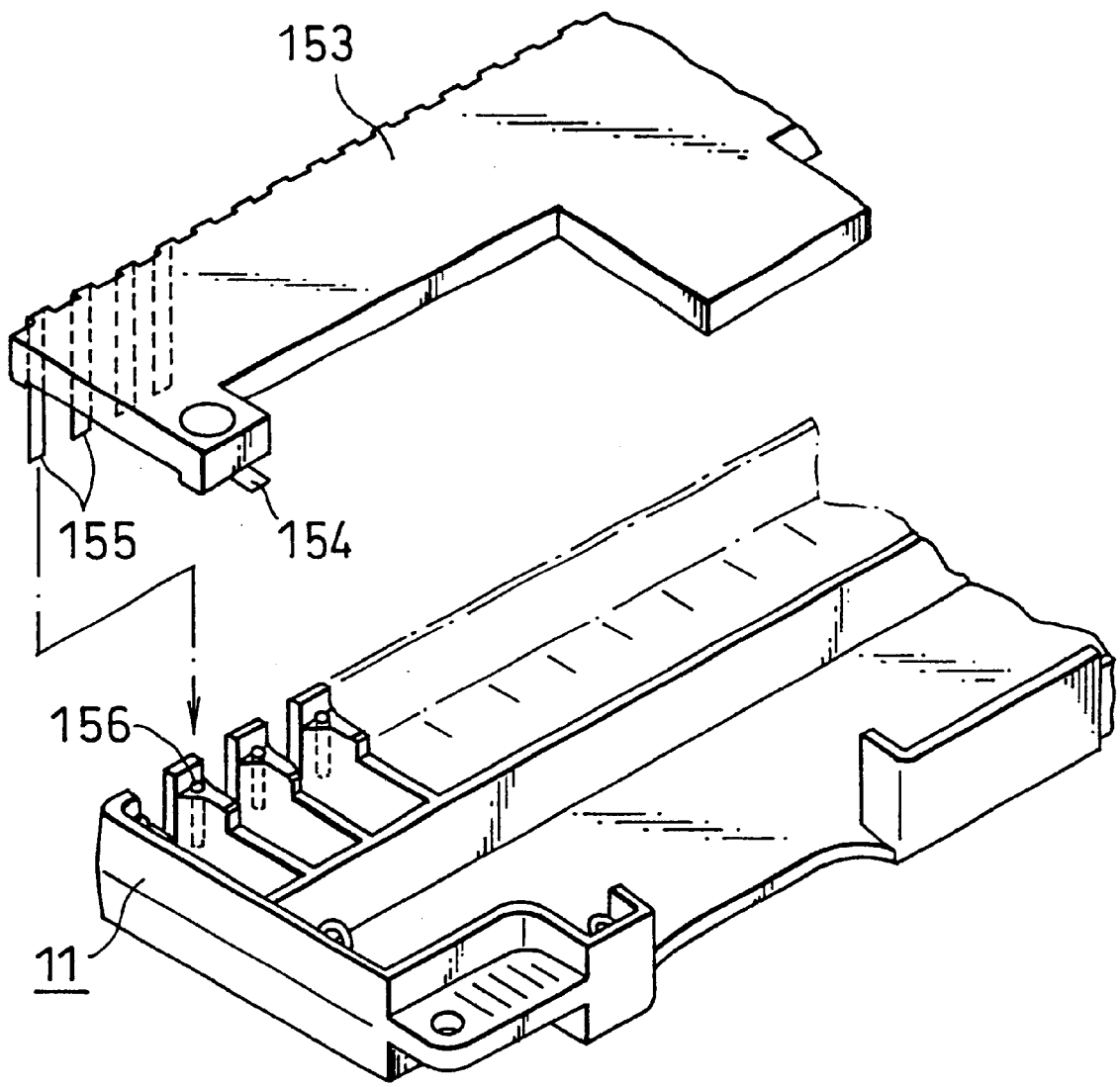
FIG. 32 is an exploded perspective view showing a shield plate and a shield piece.
Figure 33:
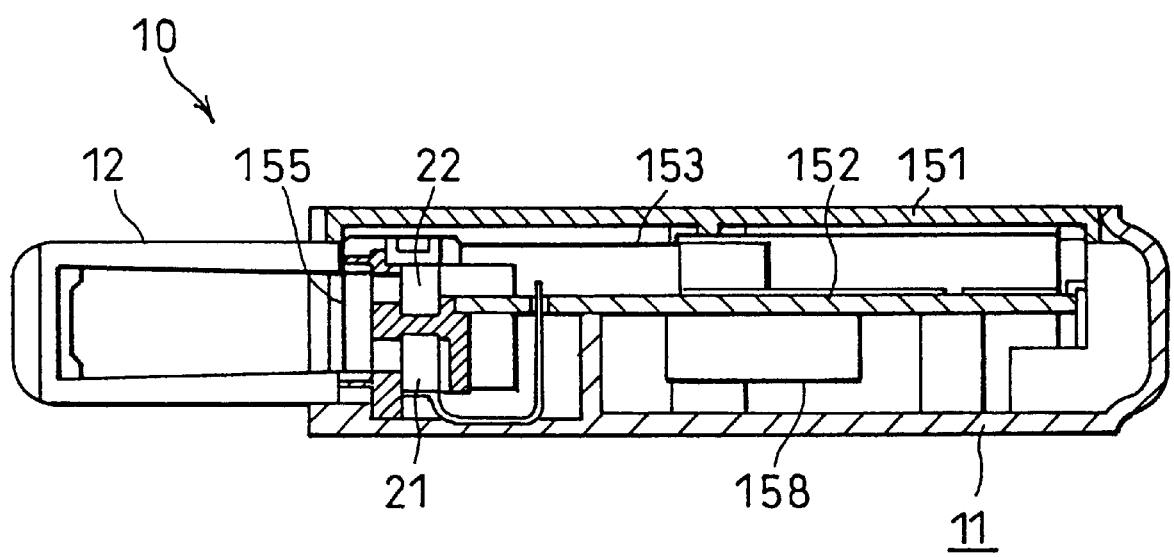
FIG. 33 is a transverse sectional view of the wafer sensor.

FIG. 28 illustrates the manner in which the 13 light-projecting elements L1–L13 and 13 photoreceptor elements D1–D13 are driven, or the manner in which the gates are controlled, and the manner in which an object is sensed.

The object sensing operation is carried out at regular intervals successively in the manner of the first channel, second channel, . . . , 25th channel. On the first channel, the light-projecting element L1 is driven and the gate of photoreceptor element D1 opens. On the second channel, the light-projecting element L2 is driven and the gate of photoreceptor element D1 opens. On the third channel, the light-projecting element L2 is driven and the gate of photoreceptor element D2 opens. Thus, with the exception of the light-projecting element on the leading end, light-projecting elements are driven for a length of time equivalent to two consecutive channels. Gates of the photoreceptor elements, with the exception of the photoreceptor element on the trailing end, are opened twice over a period of time equivalent to two channels and pass photoreception signals that are based upon projected light from two different light-projecting elements.

Two threshold values TH1, TH2 have been set and are stored in the ROM 139. The threshold value TH1 is for discriminating a photoreception level indicative of the absence of a wafer and the photoreception level indicative of a transparent (or semi-transparent) wafer, and the threshold value TH2 is for discriminating the photoreception level indicative of a transparent (or semi-transparent) wafer and of an opaque wafer.

When absence of a wafer has been discriminated in either discrimination based upon threshold value TH1 or discrimination based upon threshold value TH2, the final decision is that a wafer is absent. In a case where discrimination using the threshold value TH1 indicates presence of a wafer and discrimination using the threshold value TH2 indicates absence of a wafer, the decision rendered is that a transparent (or semi-transparent) wafer is present. In a case where presence of a wafer is indicated by discrimination using both of the threshold values TH1 and TH2, the decision rendered is that an opaque wafer is present.

In order to improve reliability, the above-described measurements may be repeated a plurality of times and only if the same results are obtained in all measurements would the results be output as the final detection output.

This makes it possible to sense, at one stroke, at which of a multiplicity of positions wafers are present (or absent) as well as the kinds of wafers. Moreover, it is possible to distinguish between transparent and opaque wafers. The number of light-projecting elements and the number of photoreceptor elements are approximately the half of the number of channels.

Fourth Embodiment

A fourth embodiment relates to the structure of a static-electricity shield of a wafer sensor. The structure internally of the case of the wafer sensor according to the first embodiment will be described with reference to FIGS. 29 to 33.

A multiplicity of the sensing arms 12 are provided on one side of the wafer case 11, as mentioned above, and the arm frames thereof project outwardly of the case. The wafer case 11 accommodates a printed circuit board 152 on which a sensing circuit is mounted. The leads of the light-projecting elements 21 and photoreceptor elements 22 of the sensing arms 12 are connected by soldering to a wiring pattern formed on the circuit board 152. One side of the wafer case 11 is open and is covered by a freely removably cover 151.

As mentioned above, the photoreceptor elements 22 are accommodated in the shield case 23 (see FIG. 4). The shield case 23 is connected to the ground of printed circuit board 152.

A shield plate 153 is provided so as to cover the photoreceptor elements 22 and the entire surface of the printed circuit board 152. The shield plate 153 is formed from a thin, electrically conductive material and the periphery thereof is bent to thereby cover not only one side of the board 152 but also the periphery thereof. The shield plate 153 is connected to a ground wiring pattern (ground line) of the board 152.

Shield pieces 155 extend at right angles from the front edge of the shield plate 153 at positions between the sensing arms 12. The shield pieces 155 are inserted into holes 156 formed in the case 11. The spaces between the sensing arms 12 are covered and shielded by the shield pieces 155. Holes provided for shrinkage cavatiy prevention when the resin of the case is molded may be utilized advantageously as the holes 156.

The input/output cable 41 is led out from the board 152 and a connector 157 is connected to the distal end of the cable 41.

The underside of the board 152 is provided with a sensing circuit the necessary portions of which are covered by an auxiliary shield member 158. The auxiliary shield member 158 also is formed by bending the edge of a thin, plate-shaped body consisting of an electrically conductive material, and the leads thereof are connected to a ground line on the board 152 by soldering.

Even if the wafers 9 become charged with static electricity, what penetrates the spaces between the wafers 9 are the distal ends of the sensing arms 12, and there is an insulating distance between the wafers 9 and the light-projecting elements 21 and photoreceptor elements 22, as mentioned earlier. The static electricity that has charged the wafers 9, therefore, can be prevented from discharging into the light-projecting elements 21 or photoreceptor elements 22 and sensing circuit, or such discharge is made extremely difficult to occur.

Even if the static electricity that has charged the wafers 9 should happen to be discharged from the wafers, the photoreceptor elements 22 and sensing circuit, etc., are shielded by the grounded shield plate 153, shield case 23, shield piece 155 and auxiliary shield member 158. As a result, malfunction and destruction of the sensing circuit, especially the photoreceptor elements 22, due to electric discharge can be prevented. The shield piece 155 is effective in positively shielding against electric discharge from the edges of the wafers to the front side of the case.

The entirety of the printed circuit board 152 may be covered with shielding foil. Conversely, only the shield case 23 of the photoreceptor elements 22 may be provided. The shield piece 155 may be deleted.

What is claimed is:

1. A multiple transmission-type photoelectric sensor in which a plurality of sensing arms are provided in spaced-apart relation on a sensor case so as to extend outwardly of the case, comprising:

a plurality of light-projecting elements and a plurality of photoreceptor elements are provided inside the sensor case;

one pair of the light-projecting and photoreceptor elements correspond to each sensing arm; and a distal end of each sensing arm is provided with a first deflecting member for directing projected light from the corresponding light-projecting element toward a neighboring sensing arm on one side, a second deflecting member for directing projected light from the neighboring sensing arm on one side toward the corresponding photoreceptor element, and a third deflecting member for returning the projected light from a neighboring sensing arm on the other side to the neighboring sensing arm on the other side.

2. A multiple transmission-type photoelectric sensor according to claim 1, wherein there are provided at least one of first light guides for guiding projected light from the light-projecting elements to the first deflecting members and second light guides for guiding light from the second deflecting members to the photoreceptor elements.

3. A multiple transmission-type photoelectric sensor according to claim 1, having:
drive means for driving a plurality of light-projecting elements sequentially at predetermined time intervals; and
means for capturing, in sync with driving of the light-projecting elements, a photoreception signal of a prescribed photoreceptor element which receives projected light from a light-projecting element that is driven.

4. A multiple transmission-type photoelectric sensor according to claim 3, further having decision means having at least one threshold value for discriminating an output signal of a photoreceptor element based upon this threshold value, thereby outputting a detection signal indicative of an object to be sensed.

5. A multiple transmission-type photoelectric sensor according to claim 4, wherein said threshold value is for distinguishing between absence of a transparent body and presence of a transparent body.

6. A multiple transmission-type photoelectric sensor according to claim 4, wherein said threshold value is for distinguishing between absence of a semi-transparent body and presence of a semi-transparent body.

7. A multiple transmission-type photoelectric sensor according to claim 4, wherein said threshold value is for distinguishing between a transparent body and a semi-transparent body.

8. A multiple transmission-type photoelectric sensor according to claim 4, wherein said threshold value is for distinguishing between a transparent body and an opaque body.

9. A multiple transmission-type photoelectric sensor according to claim 4, wherein said threshold value is for distinguishing between a semi-transparent body and an opaque body.

10. A multiple transmission-type photoelectric sensor according to claim 4, wherein said threshold value is for distinguishing between absence or presence of an object.

11. A multiple transmission-type photoelectric sensor in which a plurality of sensing arms are provided in spaced-apart relation on a sensor case so as to extend outwardly of the case, comprising:
a plurality of light-projecting elements and a plurality of photoreceptor elements are provided inside the sensor case;
one light-projecting element or one photoreceptor element corresponds to each sensing arm;
the distal end of the sensing arm that corresponds to the light-projecting element is provided with a first deflecting member which splits the projected light from the light-projecting element into two portions and directs these two portions toward the neighboring sensing arms arranged respectively on either side of the sensing arm; and
the distal end of the sensing arm that corresponds to the photoreceptor element is provided with a second deflecting member which directs the projected light from the neighboring sensing arm toward the corresponding photoreceptor element,
wherein the first deflecting member directs the optical path of the projected light obliquely with respect to a direction in which the sensing arm and the neighboring sensing arms are arrayed, and the second deflecting member directs the light, which has advanced obliquely with respect to the direction in which the sensing arm and the neighboring sensing arms are arrayed, toward the photoreceptor element,
wherein a front side of the photoreceptor element is provided with a slit for limiting impinging light, and
wherein the photoreceptor element comprises a position sensing device that generates a sensed position output signal which changes based on a position where the light impinges.

12. A multiple transmission-type photoelectric sensor according to claim 11, further having decision means for discriminating the sensed-position output signal of the position sensing device and outputting a signal indicative of sensing of an object to be sensed.

13. A multiple transmission-type photoelectric sensor according to claim 11, further having:
first discriminating means for discriminating the sensed-position output signal of the position sensing device;
second discriminating means for discriminating an output signal of the position sensing device indicative of amount of received light; and
decision means for subjecting a discrimination output of the first discriminating means and a discrimination output of the second discriminating means to a logic operation and outputting a signal relating to sensing of an object to be sensed.

14. A transmission-type photoelectric sensor which includes a first sensing arm and a second sensing arm and a third sensing arm disposed respectively on either side of the first sensing arm across sensing areas defined therebetween, comprising:
the first sensing arm having a first splitting and deflecting member at a distal end thereof for splitting, into two portions, projected light received from a light-projecting element, which projected light is introduced from a base end of the first sensing arm and advances along the longitudinal direction of the arm, the first splitting and deflecting member deflecting these split portions of light approximately at right angles, and directing these split portions of light toward the sensing areas on both sides;
the second and third sensing arms respectively having second and third deflecting members at respective distal ends thereof for deflecting light, which has advanced from the first splitting and deflecting member through the sensing areas, approximately at right angles, causing the light to advance along the longitudinal direction of the arms and introducing the light to photoreceptor elements,
wherein said first splitting and deflecting member deflects projected light in an oblique direction with respect to a direction in which the first, second and third sensing arms are arrayed,
wherein said second and third deflecting members deflect light, which has advanced through the sensing areas obliquely, in the longitudinal direction of the second and third sensing arms, respectively,
wherein the photoreceptor element comprises a position sensing device that generates a sensed position output signal which changes based on a position where the light impinges.

15. A transmission-type photoelectric sensor in which at least a first sensing arm and a second sensing arm are disposed so as to oppose each other across a sensing area defined therebetween, comprising:

the first sensing arm having a first deflecting member at a distal end thereof for deflecting received projected light from a light-projecting element, which projected light is introduced from a base end of the first sensing arm and advances along the longitudinal direction of the first sensing arm, the first deflecting member deflecting the received projected light in a direction that is approximately perpendicular to the longitudinal direction of the arm and oblique with the respect to a direction in which the first and second sensing arms are arrayed, thereby directing the light toward the sensing area; and the second sensing arm having a second deflecting member at a distal end thereof for deflecting light, which has advanced from the first deflecting member of the first sensing arm obliquely through the sensing area, in an approximately perpendicular direction, causing the light to advance along the longitudinal direction of the second sensing arm and introducing the light to a photoreceptor element, wherein the photoreceptor element also comprises a position sensing device that generates a sensed position output signal that changes based on a position where the light impinges.

16. A transmission-type photoelectric sensor according to claim 15, wherein both the first sensing arm and the second sensing arm are provided with the first and second deflecting members.

17. A transmission-type photoelectric sensor according to claim 15, wherein the front side of the photoreceptor element is provided with a slit for limiting impinging light.

18. A transmission-type photoelectric sensor according to claim 15, further comprising:

first discriminating means for discriminating a level of the sensed-position output signal from the position sensing device;

second discriminating means for discriminating the level of a signal from the position sensing device indicative of sensed amount of received light; and means for subjecting results of discriminating by the first discriminating means and second discriminating means to a logic operation.

* * * * *

UNITED STATES PATENT AND TRADEMARK OFFICE
CERTIFICATE OF CORRECTION

PATENT NO. : 6,528,808 B1  
DATED : March 4, 2003  
INVENTOR(S) : Hideaki Takiguchi It is certified that error appears in the above-identified patent and that said Letters Patent is hereby corrected as shown below:

<u>Title page, Item [54] and Column 1, lines 1 and 2,</u>  
Please change the title from "TRANSMITTING PHOTOELECTRIC SENSOR ARRAY" to -- MULTIPLE TRANSMISSION-TYPE PHOTOELECTRIC SENSOR --.

Signed and Sealed this

Ninth Day of September, 2003

JAMES E. ROGAN  
*Director of the United States Patent and Trademark Office*